(12) United States Patent
Yuan et al.

(10) Patent No.: US 12,520,667 B2
(45) Date of Patent: Jan. 6, 2026

(54) DISPLAY SUBSTRATE INCLUDING RING STORAGE CAPACITOR, MANUFACTURING METHOD THEREOF, AND DISPLAY APPARATUS HAVING SAME

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Maoning Zhang, Beijing (CN); Chao Jiao, Beijing (CN); Zhidong Yuan, Beijing (CN); Dacheng Zhang, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 892 days.

(21) Appl. No.: 17/779,143

(22) PCT Filed: Jul. 12, 2021

(86) PCT No.: PCT/CN2021/105780
§ 371 (c)(1),
(2) Date: Jan. 19, 2023

(87) PCT Pub. No.: WO2023/283768
PCT Pub. Date: Jan. 19, 2023

(65) Prior Publication Data
US 2024/0172480 A1   May 23, 2024

(51) Int. Cl.
*H01L 29/08* (2006.01)
*H10K 59/12* (2023.01)
(Continued)

(52) U.S. Cl.
CPC ..... *H10K 59/1216* (2023.02); *H10K 59/1201* (2023.02); *H10K 59/122* (2023.02);
(Continued)

(58) Field of Classification Search
CPC ............. H10K 59/1216; H10K 59/131; H10K 59/1201; H10K 59/122; H10K 59/126; H10K 59/80524
(Continued)

(56) References Cited

U.S. PATENT DOCUMENTS

2010/0201658 A1  8/2010  Koshiishi et al.
2016/0372533 A1  12/2016  Kim et al.
2022/0037448 A1  2/2022  Ma et al.

FOREIGN PATENT DOCUMENTS

CN   101800195 A    8/2010
CN   101587906 B  * 7/2011  ............ H01L 27/12
(Continued)

OTHER PUBLICATIONS

Cite the machine translation Huang Z (CN-111862816-A).*
(Continued)

*Primary Examiner* — Phuc T Dang
(74) *Attorney, Agent, or Firm* — Ling Wu; Stephen Yang; Ling and Yang Intellectual Property

(57) ABSTRACT

Provided is a display substrate and a manufacturing method therefor, and a display apparatus. The display substrate includes multiple sub-pixels, at least one sub-pixel includes a drive circuit layer disposed on the substrate, the drive circuit layer includes a ring storage capacitor constituting a pixel drive circuit; the ring storage capacitor includes a first electrode plate and a second electrode plate, wherein, the first electrode plate includes a first housing surrounding at least one first opening and the second electrode plate includes a second housing surrounding at least one second
(Continued)

opening; an orthographic projection of the first housing on the substrate at least partially overlaps an orthographic projection of the second housing on the substrate, and the first housing and the second housing form a capacitor housing around at least one capacitor opening.

20 Claims, 17 Drawing Sheets

(51) Int. Cl.
*H10K 59/121* (2023.01)
*H10K 59/122* (2023.01)
*H10K 59/126* (2023.01)
*H10K 59/131* (2023.01)
*H10K 59/35* (2023.01)
*H10K 59/80* (2023.01)

(52) U.S. Cl.
CPC ......... *H10K 59/126* (2023.02); *H10K 59/131* (2023.02); *H10K 59/351* (2023.02); *H10K 59/80524* (2023.02)

(58) Field of Classification Search
USPC .......................................................... 257/40
See application file for complete search history.

(56) References Cited

FOREIGN PATENT DOCUMENTS

| CN | 106057821 A | | 10/2016 | |
| CN | 107978622 A | * | 5/2018 | ........... G09G 3/3208 |
| CN | 209912874 U | | 1/2020 | |
| CN | 111312770 A | | 6/2020 | |
| CN | 111862816 A | * | 10/2020 | ............... G09F 9/30 |
| CN | 113053912 A | * | 6/2021 | ......... H01L 27/1214 |
| WO | WO-2015190092 A1 | * | 12/2015 | ......... H01L 27/3244 |

OTHER PUBLICATIONS

Cite the machine translation Hiraoka T (WO-2015190092-A1).*
Cite the machine translation Gao L (CN-113053912-A).*
Cite the machine translation Zhu R (CN-107978622-A).*
Cite the machine translation Sagawa Y (CN-101587906-B).*

* cited by examiner

DISPLAY SUBSTRATE INCLUDING RING STORAGE CAPACITOR, MANUFACTURING METHOD THEREOF, AND DISPLAY APPARATUS HAVING SAME

CROSS-REFERENCE TO RELATED APPLICATION

This application is a national stage application of PCT Application No. PCT/CN2021/105780, which is filed on Jul. 12, 2021, and entitled "Display Substrate, Manufacturing Method Thereof, and Display Apparatus", the content of which should be regarded as being incorporated herein by reference.

TECHNICAL FIELD

The present disclosure relates to, but is not limited to, the field of display technologies, and particularly to a display substrate, a method for manufacturing the display substrate, and a display apparatus.

BACKGROUND

An Organic Light Emitting Diode (OLED) is an active light emitting display apparatus, which has the advantages of luminescence, ultra-thinness, wide angle of view, high brightness, high contrast, low power consumption, extremely high response speed, etc. With the continuous development of display technology, OLED technology is increasingly applied in flexible display apparatuses, and has gradually become a next generation display technology with great development prospects. According to different driving modes, OLEDs may be divided into two types, a passive matrix (PM) type and an active matrix (AM) type. An AMOLED is a current driven device which uses an independent thin film transistor (TFT) to control each sub-pixel, each sub-pixel may be continuously and independently driven to emit light.

With the continuous development of display technology, the OLED technology is increasingly applied in transparent display. Transparent display is an important personalized display field of the display technology, refers to display of images in a transparent state, in which a viewer can see not only images in a display apparatus, but also scenes behind the display apparatus, and Virtual Reality (VR) and Augmented Reality (AR) and 3D display functions can be implemented.

SUMMARY

The following is a summary of subject matters described herein in detail. This summary is not intended to limit the scope of protection of claims.

In one aspect, the present disclosure provides a display substrate including multiple sub-pixels, at least one sub-pixel includes a drive circuit layer disposed on the substrate, the drive circuit layer includes a ring storage capacitor constituting a pixel drive circuit; the ring storage capacitor includes a first electrode plate and a second electrode plate, wherein, the first electrode plate includes a first housing surrounding at least one first opening and the second electrode plate includes a second housing surrounding at least one second opening; an orthographic projection of the first housing on the substrate at least partially overlaps an orthographic projection of the second housing on the substrate, and the first housing and the second housing form a capacitor housing around at least one capacitor opening.

In an exemplary embodiment, the orthographic projection of the second housing on the substrate is within the range of the orthographic projection of the first housing on the substrate, the orthographic projection of the first opening on the substrate is within the range of the orthographic projection of the second opening on the substrate, and the first housing and the second housing form a capacitor housing surrounding at least one capacitor opening.

In an exemplary embodiment, the capacitor housing includes a first bezel, a second bezel, a third bezel and a fourth bezel forming a ring, and at least one spacer bezel; the first bezel and the third bezel are oppositely arranged, and the second bezel and the fourth bezel are oppositely arranged; a first end of at least one spacer bezel is connected to the first bezel, and a second end of the spacer bezel is connected to the third bezel.

In an exemplary embodiment, a side of the drive circuit layer away from the substrate is provided with an emitting structure layer, the emitting structure layer includes a pixel define layer, and a pixel opening defining a light-emitting region is provided on the pixel define layer; an orthographic projection of the ring storage capacitor on the substrate does not overlap an orthographic projection of the pixel opening on the substrate.

In an exemplary embodiment, a side of the drive circuit layer away from the substrate is provided with an emitting structure layer, the emitting structure layer includes a pixel define layer, and a pixel opening defining a light-emitting region is provided on the pixel define layer; the orthographic projection of the ring storage capacitor on the substrate at least partially overlaps the orthographic projection of the pixel opening on the substrate.

In an exemplary embodiment, an orthographic projection of the at least one capacitor opening on the substrate is within the range of an orthographic projection of the pixel opening on the substrate.

In an exemplary embodiment, the orthographic projection of the ring storage capacitor on the substrate at least partially overlapping the orthographic projection of the pixel opening on the substrate includes any one or more of the following: the orthographic projection of the first bezel on the substrate is within the range of the orthographic projection of the pixel opening on the substrate, the orthographic projection of the second bezel on the substrate is within the range of the orthographic projection of the pixel opening on the substrate, the orthographic projection of the third bezel on the substrate is within the range of the orthographic projection of the pixel opening on the substrate, and the orthographic projection of the fourth bezel on the substrate is within the range of the orthographic projection of the pixel opening on the substrate.

In an exemplary embodiment, the orthographic projection of the ring storage capacitor on the substrate at least partially overlapping the orthographic projection of the pixel opening on the substrate includes any one or more of the following: an orthographic projection of an outer edge of the first bezel on the substrate substantially overlaps an orthographic projection of an edge of the pixel opening on the substrate, an orthographic projection of an outer edge of the second bezel on the substrate substantially overlaps an orthographic projection of an edge of the pixel opening on the substrate, an orthographic projection of the outer edge of the third bezel on the substrate substantially overlaps an orthographic projection of an edge of the pixel opening on the substrate, and an orthographic projection of the outer edge of the fourth bezel on the substrate substantially overlaps an orthographic projection of an edge of the pixel opening on the substrate.

In an exemplary embodiment, in a plane parallel to the display substrate, the shape of the capacitor opening includes any one or more of the following: triangle, rectangle, trapezoid, parallelogram, pentagon, hexagon, circle and ellipse.

In an exemplary embodiment, the first electrode plate and the second electrode plate are transparent conductive layers forming a transparent ring storage capacitor.

In an exemplary embodiment, the number of capacitor openings is plural.

In an exemplary embodiment, the multiple sub-pixels include a first sub-pixel, a second sub-pixel, a third sub-pixel and a fourth sub-pixel arranged in sequence along a first direction, multiple capacitor openings in at least one sub-pixel are arranged in sequence along a second direction, the number of capacitor openings in the four sub-pixels is different, and the first direction intersects the second direction.

In an exemplary embodiment, the number of capacitor openings in the first sub-pixel is 5, the number of capacitor openings in the second sub-pixel is 2, the number of capacitor openings in the third sub-pixel is 3, and the number of capacitor openings in the fourth sub-pixel is 4.

In an exemplary embodiment, the ratio of an area of the orthographic projection of the capacitor opening on the substrate to an area of the orthographic projection of the capacitor housing on the substrate is 0.8 to 1.2.

In an exemplary embodiment, the drive circuit layer of at least one sub-pixel includes a first conductive layer, a second conductive layer, a semiconductor layer, a third conductive layer and a fourth conductive layer sequentially arranged on the substrate, the first electrode plate of the ring storage capacitor is located on the first conductive layer, and the second electrode plate of the ring storage capacitor is located on the semiconductor layer.

In an exemplary embodiment, within at least one sub-pixel, the pixel drive circuit further includes a first transistor, a second transistor, and a third transistor; active layers of the first, second and third transistors are located on the semiconductor layer, gate electrodes of the first, second and third transistors are located on the third conductive layer, and first and second electrodes of the first, second and third transistors are located on the fourth conductive layer.

In an exemplary embodiment, in at least one sub-pixel, the pixel drive circuit further includes a first scan signal line, a second scan signal line, a first power supply line, a data line and a compensation signal line, wherein the first scan signal line and the second scan signal line are located on the third conductive layer, and the first power supply line, the data line and the compensation signal line are located on the fourth conductive layer.

In an exemplary embodiment, at least one via is provided on the first scan signal line and the second scan signal line; an orthographic projection of the via on the substrate at least partially overlaps an orthographic projection of the first power supply line on the substrate, or, the orthographic projection of the via on the substrate at least partially overlaps the orthographic projection of the data signal line on the substrate, or the orthographic projection of the via on the substrate at least partially overlaps the orthographic projection of the compensation signal line on the substrate.

In an exemplary embodiment, an area of the orthographic projection of the via on the substrate is smaller than an area of the orthographic projection of the capacitor opening on the substrate.

In an exemplary embodiment, in at least one sub-pixel, the pixel drive circuit further includes a shield layer located on the second conductive layer, and an orthographic projection of the active layer of the second transistor on the substrate is within a range of the orthographic projection of the shield layer on the substrate.

In an exemplary embodiment, in at least one sub-pixel, a second region of the active layer of the first transistor is connected to the second electrode plate, and the second region is in a polyline shape protruding toward adjacent sub-pixels.

In another aspect, the present disclosure further provides a display apparatus, including the aforementioned display substrate.

In another aspect, the present disclosure further provides a method for preparing a display substrate including multiple sub-pixels, wherein at least one sub-pixel includes a drive circuit layer disposed on the substrate, the drive circuit layer includes a ring storage capacitor constituting a pixel drive circuit; the method includes:

forming a first electrode plate, the first electrode plate includes a first housing surrounding at least one first opening;

forming a second electrode plate, the second electrode plate includes a second bezel surrounding at least one second opening; an orthographic projection of the first housing on the substrate at least partially overlaps an orthographic projection of the second housing on the substrate, and the first housing and the second housing form a capacitor housing around at least one capacitor opening.

Other aspects may be comprehended upon reading and understanding the drawings and detailed descriptions.

BRIEF DESCRIPTION OF DRAWINGS

The accompanying drawings are used for providing further understanding of technical solutions of the present disclosure, constitute a part of the specification, and are used for explaining the technical solutions of the present disclosure together with the embodiments of the present disclosure, and do not constitute limitations on the technical solutions of the present disclosure. Shapes and sizes of various components in the accompanying drawings do not reflect actual scales and are only intended to illustrate contents of the present disclosure.

FIG. 5b is an equivalent circuit diagram of the pixel drive circuit in the four sub-pixels shown in FIG. 5a.

FIG. 6b is a schematic plan view of the first conductive layer in a sub-pixel of FIG. 6a.

FIG. 6c is a schematic plan view of another first conductive layer in a sub-pixel of FIG. 6a.

FIG. 7b is a schematic plan view of the second conductive layer in FIG. 7a.

FIG. 8b is a schematic plan view of the semiconductor layer in FIG. 8a.

FIG. 9b is a schematic plan view of the third conductive layer in FIG. 9a.

FIG. 10b is a schematic plan view of multiple vias in FIG. 10a.

FIG. 11b is a schematic plan view of the fourth conductive layer in FIG. 11a.

FIG. 12b is a schematic plan view of multiple vias in FIG. 12a.

FIG. 13b is a schematic plan view of the fifth conductive layer in FIG. 13a.

FIG. 14b is a schematic plan view of the pixel define layer in FIG. 14a.

Figure 1:
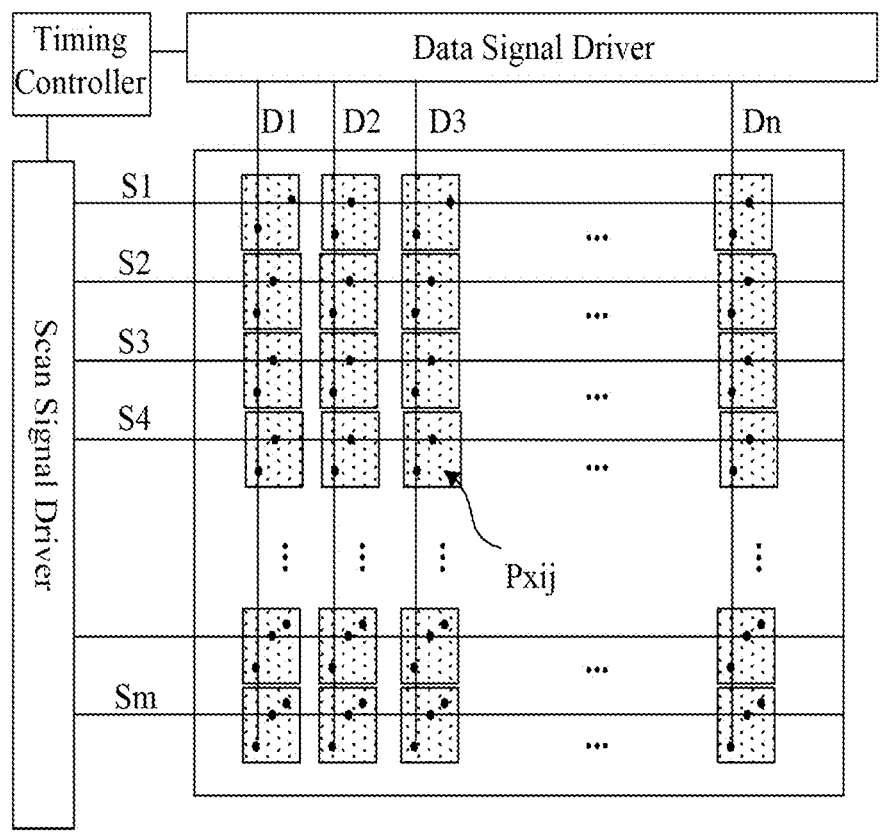
FIG. 1 is a schematic diagram of a structure of a display apparatus.

DESCRIPTION OF REFERENCE SIGNS 11-first electrode plate; 12-circuit part; 13-connection part;
14-first opening; line; 21-power connection line; 22-compensation connection line;
23-shield layer; 24-interlayer connection electrode; 25-shield opening;
23-shield layer; 24-interlayer connection electrode; 31-first active layer;
32-second active layer; 33-third active layer; plate; 34-second electrode plate;
35-second opening; 41-first scan signal line 42-second scan signal line
43-second gate electrode; 44-auxiliary power supply line; 45-auxiliary data line;
46-auxiliary compensation line; 51-first power supply line; 52-data signal line;
53-compensation signal line; 54-first connection electrode; 55-second connection line;
56-third connection electrode; 57-fourth connection electrode; 58-fifth connection Electrode;
80-short circuit point; 81-cut line; 101-substrate;
102-drive circuit layer; 103-emitting structure 104-encapsulation layer;
301-anode; 302-pixel define layer; 303-organic emitting layer;
304-cathode; 401-first encapsulation layer; 402-second encapsulation layer;
403-third encapsulation layer.

DETAILED DESCRIPTION

To make objectives, technical solutions, and advantages of the present disclosure clearer, the embodiments of the present disclosure will be described in detail with reference to the accompanying drawings. Their implementations may be carried out in many different forms. Those of ordinary skill in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments may be arbitrarily combined with each other without conflicts.

The scale of the drawings in the present disclosure may be used as a reference in the actual process, but is not limited thereto. For example, the width-to-length ratio of the channel, the thickness and spacing of each film layer, and the width and spacing of each signal line may be adjusted according to actual needs. The number of pixels in the display substrate and the number of sub-pixels in each pixel are not limited to the number shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to the direction in which the various constituent elements are described. Therefore, description is not limited to the words and phrases used in the specification, and appropriate substitutions may be made according to situations.

In the specification, unless otherwise specified and defined explicitly, terms "mount", "mutually connect", and "connect" should be understood in a broad sense. For example, the connection may be a fixed connection, a detachable connection or an integrated connection, or may be a mechanical connection or an electrical connection, or may be a direct connection, an indirect connection through intermediate components, or communication inside two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. It is to be noted that, in the specification, the channel region refers to a region that the current mainly flows through.

In the specification, a first electrode may be the drain electrode, and a second electrode may be the source electrode. Or, the first electrode may be the source electrode, and the second electrode may be the drain electrode. In the case that transistors with opposite polarities are used or that a current direction is changed during circuit operation, functions of "the source electrode" and "the drain electrode" may sometimes be exchanged. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with a certain electric action" is not particularly limited as long as it allows sending and receiving of electric signals between the connected constituent elements. Examples of the "element with a certain electric action" include not only an electrode and wiring, but also a switching element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon or hexagon in this specification are not strictly defined, but may be approximate triangle, rectangle, trapezoid, pentagon or hexagon, etc. There may be some small deformation caused by tolerance, and there may be guide angle, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, and a pixel array. The timing controller is connected to the data driver and the scan driver respectively, the data driver is connected to multiple data signal lines (D1 to D) respectively, and the scan driver is connected to multiple scan signal lines (S1 to Sm) respectively. The pixel array may include multiple sub-pixels Pxij, i and j may be natural numbers, at least one sub-pixel Pxij may include a circuit unit and a light emitting device connected to the circuit unit, and the circuit unit may include at least one scan signal line, at least one data signal line and a pixel drive circuit. In an exemplary embodiment, the timing controller may provide a control signal and a gray scale value suitable for the specification of the data driver to the data driver, and may provide a scan start signal, a clock signal suitable for the specification of the scan driver and the like to the scan driver. The data driver may generate data voltages to be provided to data signal lines D1, D2, D3 . . . and D using the gray scale value and the control signal received from the timing controller. For example, the data driver may sample the gray scale value by using a clock signal, and apply a data voltage corresponding to the gray scale value to the data signal lines D1 to Dn in units of pixel rows, wherein n may be a natural number. The scanning driver may generate scan signals to be provided to scan signal lines S1, S2, S3 . . . and Sm by receiving a clock signal, a scanning start signal, and the like from the timing controller. For example, the scan driver may provide sequentially a scan signal with a turn-on level pulse to the scan signal lines S1 to Sm. For example, the scan driver may be constructed in a form of a shift register and may generate a scan signal in such a manner as to transmit sequentially the scan start signal provided in a form of a turn-on level pulse to a next-stage circuit under the control of the clock signal, wherein m may be a natural number.

Figure 2:
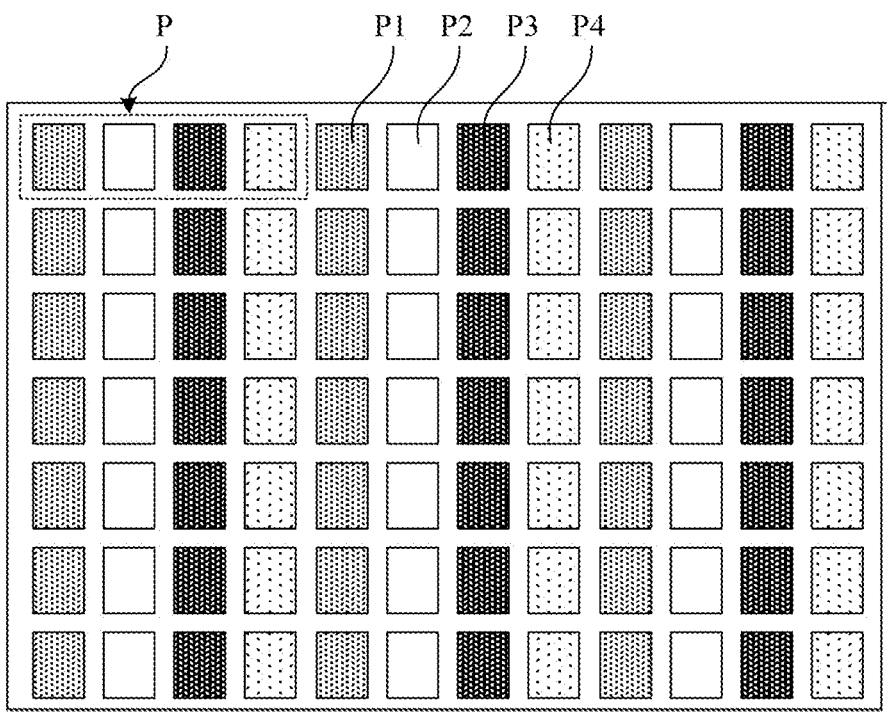
FIG. 2 is a schematic diagram of a planar structure of a display substrate.

FIG. 2 is a schematic diagram of a planar structure of a display substrate. As shown in FIG. 2, the display substrate may include multiple pixel units P arranged in a matrix. At least one of the multiple pixel units P includes a first sub-pixel P1 that emits light of a first color, a second sub-pixel P2 that emits light of a second color, a third sub-pixel P3 that emits light of a third color, and a fourth sub-pixel P4 that emits light of a fourth color, wherein, each of the four sub-pixels may include a circuit unit and a light emitting device. The circuit unit may include a scan signal line, a data signal line, and a pixel drive circuit connected to the scan signal line and the data signal line, respectively. The pixel drive circuit is configured to receive a data voltage transmitted by the data signal line and output a corresponding current to the light emitting device under the control of the scan signal line. The light emitting device in each sub-pixel is connected to the pixel drive circuit of the sub-pixel where the light emitting device is located, and is configured to emit light with a corresponding luminance in response to a current output by the pixel drive circuit of the sub-pixel where the light emitting device is located.

In an exemplary embodiment, the first sub-pixel P1 may be a red sub-pixel (R) emitting red light, the second sub-pixel P2 may be a white sub-pixel (W) emitting white light, the third sub-pixel P3 may be a blue sub-pixel (B) emitting blue light, and the fourth sub-pixel P4 may be a green sub-pixel (G) emitting green light.

In some exemplary embodiments, the sub-pixel may be a rectangle, a rhombus, a pentagon, or a hexagon. In an exemplary embodiment, four sub-pixels may be arranged in a horizontal side-by-side manner to form an RWBG pixel arrangement. In another exemplary embodiment, the four sub-pixels may be arranged in a square, diamond, vertical juxtaposition or the like, and the present disclosure is not limited herein.

In an exemplary embodiment, multiple sub-pixels sequentially arranged in the horizontal direction are referred to as pixel rows, and multiple sub-pixels sequentially arranged in the vertical direction are referred to as pixel columns; the multiple pixel rows and the multiple pixel columns together form a pixel array arranged in an array.

Figure 3:
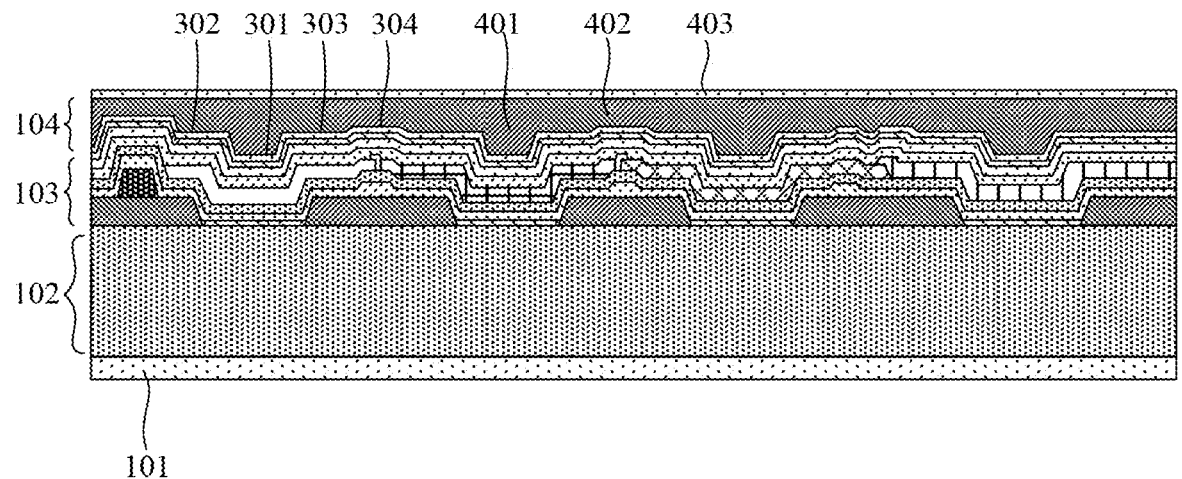
FIG. 3 is a schematic diagram of a sectional structure of a display substrate.

FIG. 3 is a schematic diagram of a sectional structure of a display substrate, and illustrates a structure of four sub-pixels of the display substrate. As shown in FIG. 3, on a plane perpendicular to the display substrate, each sub-pixel of the display substrate may include a drive circuit layer 102 arranged on a substrate 101, a emitting structure layer 103 arranged on a side of the drive circuit layer 102 away from the substrate, and an encapsulation layer 104 arranged on a side of the emitting structure layer 103 away from the substrate.

In an exemplary implementation mode, the substrate 101 may be a flexible substrate, or a rigid substrate. The drive circuit layer 102 of each sub-pixel may include a pixel drive circuit composed of multiple transistors and storage capacitors. The emitting structure layer 103 of each sub-pixel may include a light-emitting device composed of multiple film layers, and the multiple film layers may include an anode 301, a pixel define layer 302, an organic emitting layer 303 and a cathode 304. The anode 301 is connected to the pixel drive circuit, the organic emitting layer 303 is connected to the anode 301, the cathode 304 is connected to the organic emitting layer 303, the organic emitting layer 303 emits light of a corresponding color under driving of the anode 301 and the cathode 304. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403 so as to prevent external water vapor from entering the emitting structure layer 103.

In an exemplary embodiment, the organic emitting layer may include a hole injection layer (HIL), a hole transport layer (HTL), an electron block layer (EBL), an emitting layer (EML), a hole block layer (HBL), an electron transport layer (ETL), and an electron injection layer (EIL) which are stacked. In an exemplary embodiment, the hole injection layer, hole transport layer, electron block layer, hole block layer, electron transport layer and electron injection layer of all sub-pixels may be a common layer connected together, and emitting layers of all sub-pixels may be a common layer connected together, or may be isolated from each other, and the emitting layers of adjacent sub-pixels may overlap slightly. In some possible implementation modes, the display substrate may include other film layers, which is not limited in the present disclosure.

Figure 4:
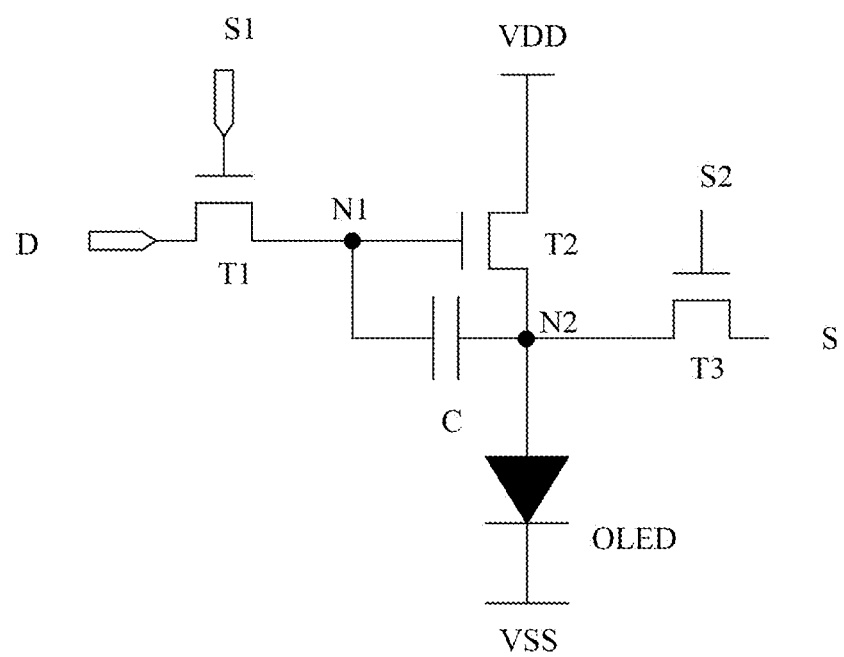
FIG. 4 is a schematic diagram of an equivalent circuit of a pixel drive circuit.

In an exemplary implementation, the pixel drive circuit may have a structure of 3T1C, 4T1C, 5T1C, 5T2C, 6T1C, 7T1C or 8T1C. FIG. 4 is a schematic diagram of an equivalent circuit of a pixel drive circuit. As shown in FIG. 4, the pixel drive circuit has a 3T1C structure, which may include three transistors (a first transistor T1, a second transistor T2, and a third transistor T3), one storage capacitor C, and six signal lines (a data signal line D, a first scan signal line S1, a second scan signal line S2, a compensation signal line S, a first power supply line VDD, and a second power supply line VSS).

In an exemplary embodiment, the first transistor T1 is a switching transistor, the second transistor T2 is a drive transistor, and the third transistor T3 is a compensation transistor. A first electrode of the storage capacitor C is coupled to the control electrode of the second transistor T2, a second electrode of the storage capacitor C is coupled to the second electrode of the second transistor T2, and the storage capacitor C is configured to store a potential of the control electrode of the second transistor T2. A control electrode of the first transistor T1 is coupled to the first scan signal line S1, a first electrode of the first transistor T1 is coupled to the data signal line D, a second electrode of the first transistor T1 is coupled to a control electrode of the second transistor T2. The first transistor T1 is configured to receive a data signal transmitted by the data signal line D under the control of the first scan signal line S1, so that the control electrode of the second transistor T2 receives the data signal. The control electrode of the second transistor T2 is coupled to the second electrode of the first transistor T1, a first electrode of the second transistor T2 is coupled to the first power supply line VDD, a second electrode of the second transistor T2 is coupled to a first electrode of a light emitting device, and the second transistor T2 is configured to generate a corresponding current at the second electrode under the control of the data signal received by the control electrode of the second transistor. A control electrode of the third transistor T3 is coupled to the second scan signal line S2, a first electrode of the third transistor T3 is coupled to the compensation signal line S, a second electrode of the third transistor T3 is coupled to the second electrode of the second transistor T2. The third transistor T3 is configured to extract a threshold voltage Vth and the mobility of the second transistor T2 in response to compensation timing to compensate the threshold voltage Vth.

In an exemplary embodiment, the light emitting device may be an OLED, including a first electrode (anode), an organic emitting layer, and a second electrode (cathode) which are stacked. The first electrode of the OLED is coupled to the second electrode of the second transistor T2, a second electrode of the OLED is coupled to the second power supply line VSS, and the OLED is configured to emit light with corresponding brightness in response to the current of the second electrode of the second transistor T2.

In an exemplary embodiment, a signal of the first power supply line VDD is a high-level signal continuously provided, and a signal of the second power supply line VSS is a low-level signal. The first transistor T1 to the third transistor T3 may be P-type transistors or may be N-type transistors. Use of the same type of transistors in a pixel drive circuit may simplify a process flow, reduce process difficulties of a display panel, and improve a yield of a product.

In an exemplary embodiment, the first transistor T1 to the third transistors T3 may adopt low temperature polysilicon thin film transistors, or oxide thin film transistors, or low temperature polysilicon thin film transistors and oxide thin film transistors. An active layer of the low temperature poly-silicon thin film transistor uses Low Temperature Poly-Silicon (LTPS for short), and an active layer of the oxide thin film transistor uses an oxide. The low temperature poly-silicon thin film transistor has the advantages of high mobility, fast charging, and the like, and the oxide thin film transistor has the advantages of low leakage current and the like. In an exemplary implementation mode, the low temperature poly-silicon thin film transistor and the oxide thin film transistor may be integrated on one display substrate to form a Low Temperature Polycrystalline Oxide (LTPO for short) display substrate, so that advantages of the two may be utilized, high Pixel Per Inch (PPI for short) and low-frequency drive may be achieved, power consumption may be reduced, and display quality may be improved. In an exemplary implementation mode, the light emitting device may be an Organic Light Emitting Diode (OLED), including a first electrode (anode), an organic emitting layer, and a second electrode (cathode) that are stacked.

In an exemplary embodiment, taking that all three transistors are N-type transistors as an example, the operation process of the pixel drive circuit illustrated in FIG. 4 may include:

In the first stage A1, the signals of the first scan signal line S1 and the second scan signal line S2 are high level signals, the data signal line D outputs the data voltage, the compensation signal line S outputs the compensation voltage, the signal of the first power supply line VDD is high level, and the signal of the second power supply line VSS is low level. The signal of the first scan signal line S1 is a high level signal, so that the first transistor T1 is turned on, the data voltage output by the data signal line D is written into the first node N1, the potential of the first node N1 is pulled high, and the storage capacitor C is charged. At this time, the potential of the first node N1 is V1=Vdata. The signal of the second scan signal line S2 is a high level signal, so that the third transistor T3 is turned on, and the compensation voltage output by the compensation signal line S is written to the second node N2. At this time, the potential the potential of the second node N2 is V2=Vs. Since the potential difference between the first node N1 and the second node N2 is greater than the threshold voltage Vth of the second transistor T2, the second transistor T2 is turned on. The power supply voltage output from the first power supply line VDD provides a driving voltage to the first electrode of the OLED through the turned-on second transistor T2 to drive the OLED to emit light.

In the second stage A2, the signals of the first scan signal line S1 and the second scan signal line S2 are low level signals, so that the first transistor T1 and the third transistor T3 are turned off, the voltage in the storage capacitor C still keeps the second transistor T2 in a turned-on state, the power supply voltage output by the first power supply line VDD continuously pulls the potential of the second node N2 up, and the OLED continuously emits light. When the potential of the second node N2 is equal to Vdata-Vth, the second transistor T2 is turned off and the OLED no longer emits light.

In an exemplary embodiment, to drive the OLED to emit light normally, the OLED and the second transistor T2 are both forward biased. In the first stage, the supply voltage output by the first power supply line VDD is greater than the data voltage output by the data signal line D, the data voltage output by the data signal line D is greater than the compensation voltage output by the compensation signal line S, and the compensation voltage output by the compensation signal line S is greater than the supply voltage output by the second power supply line VSS.

For an OLED, the gate electrode voltage of the drive transistor is maintained by a storage capacitor from one frame of data writing to the next frame of data writing. Because of the leakage current in the transistor, the voltage stored in the storage capacitor will gradually decrease, which will cause the gate electrode potential of the transistor to change, and then affect the current flowing through the organic light-emitting diode and the luminance of sub-pixels. Therefore, the electrode plate of the storage capacitor is often designed to be large enough to ensure the capacity of the storage capacitor. However, with the development of high Pixel Per Inch (PPI) display technology, especially extra-large high-resolution display, the pixel size is getting smaller, and larger electrode plates reduce the pixel aperture ratio, which not only affects the development of high-resolution display, but also causes problems such as increased power consumption and attenuation of luminescent material life.

Exemplary embodiments of the present disclosure provide a display substrate including multiple sub-pixels, at least one sub-pixel includes a drive circuit layer disposed on the substrate, the drive circuit layer includes a ring storage capacitor constituting a pixel drive circuit; the ring storage capacitor includes a first electrode plate and a second electrode plate, wherein, the first electrode plate includes a first housing surrounding at least one first opening and the second electrode plate includes a second housing surrounding at least one second opening; an orthographic projection of the first housing on the substrate at least partially overlaps an orthographic projection of the second housing on the substrate, and the first housing and the second housing form a capacitor housing around at least one capacitor opening.

In an exemplary embodiment, a side of the drive circuit layer away from the substrate is provided with an emitting structure layer, the emitting structure layer includes a pixel define layer, and a pixel opening defining a light-emitting region is provided on the pixel define layer. In an exemplary embodiment, an orthographic projection of the ring storage capacitor on the substrate does not overlap an orthographic projection of the pixel opening on the substrate, or, the orthographic projection of the ring storage capacitor on the substrate at least partially overlaps the orthographic projection of the pixel opening on the substrate. A technical solution of an exemplary embodiment of the present disclosure is described below taking an area where a ring storage capacitor overlaps with a pixel opening as an example.

Figure 5A:
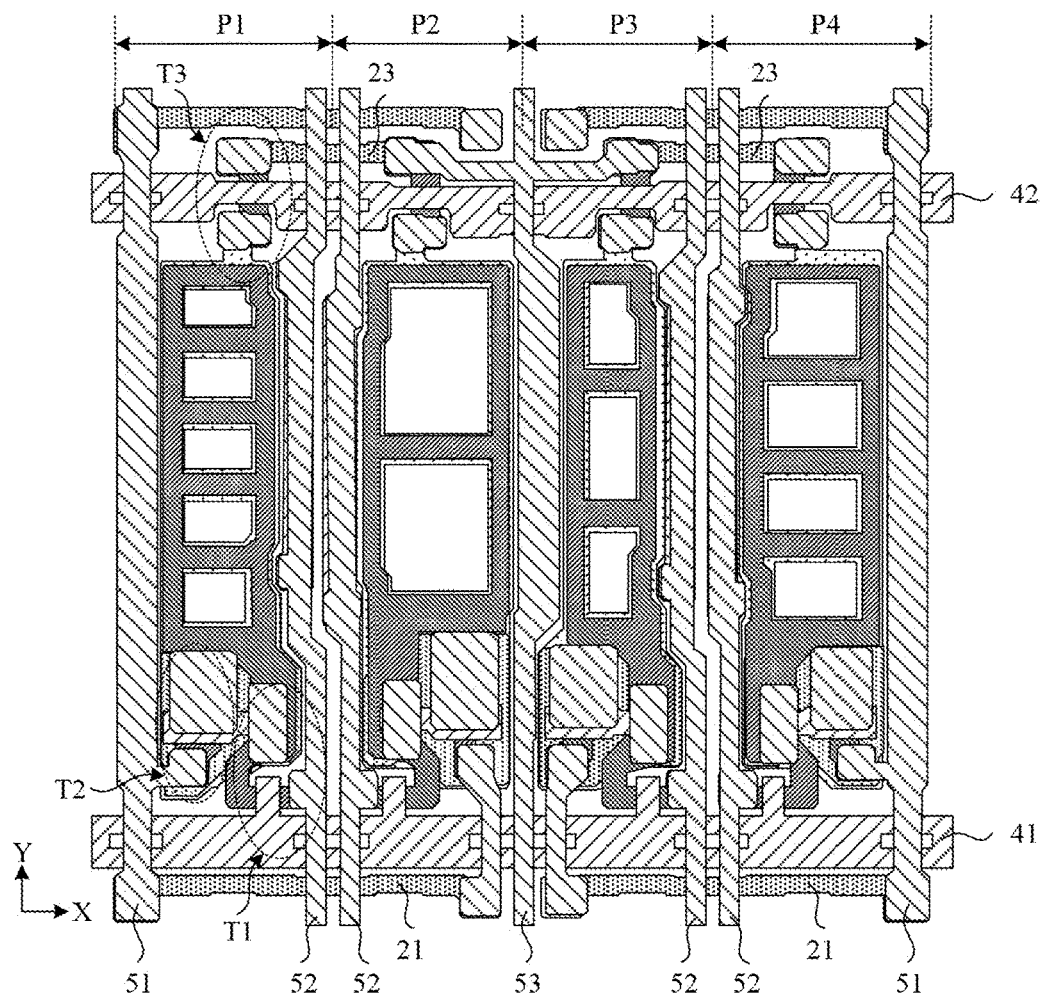
FIG. 5a is a schematic diagram of a structure of a display substrate according to an exemplary embodiment of the present disclosure.
Figure 5B:
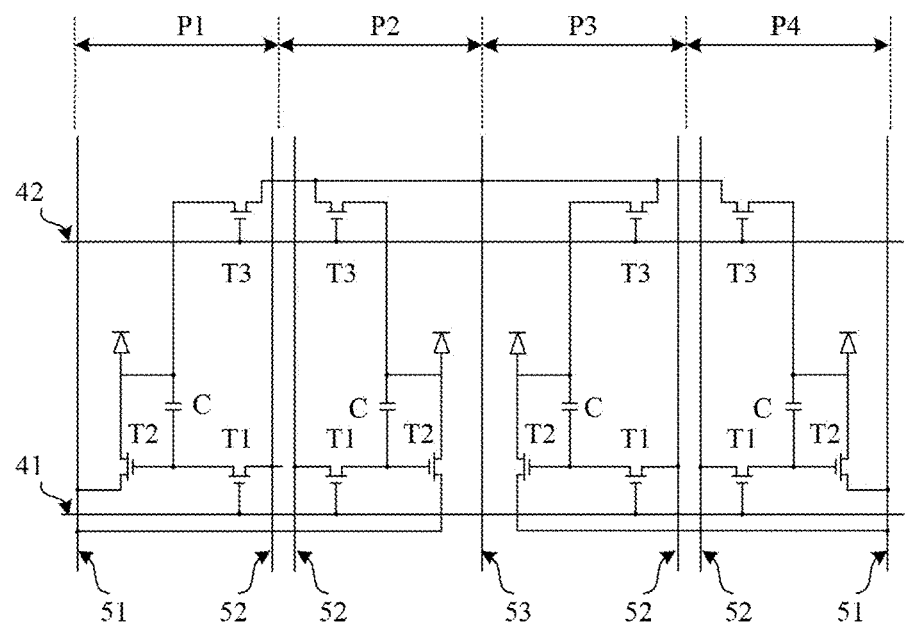

FIG. 5a is a schematic diagram of a structure of a display substrate according to an exemplary embodiment of the present disclosure, illustrating a structure of a drive circuit layer in four sub-pixels (one pixel unit) of a bottom emission display substrate, and FIG. 5b is an equivalent circuit diagram of the pixel drive circuit in the four sub-pixels shown in FIG. 5A. As shown in FIGS. 5a and 5b, in a direction parallel to the display substrate, at least one pixel unit may include a first sub-pixel P1, a second sub-pixel P2, a third sub-pixel P3, and a fourth sub-pixel P4 arranged in order along the first direction X, and each sub-pixel includes a pixel drive circuit and a storage capacitor. In the following description, the sub-pixels refer to the region in which the pixel drive circuits are provided. In an exemplary embodiment, the at least one pixel unit may further include one first scan signal line 41, one second scan signal line 42, two first power supply lines 51, four data signal lines 52, one compensation signal line 53, and four pixel drive circuits.

In an exemplary embodiment, the first scan signal line 41 and the second scan signal line 42 may extend along a first direction X and are sequentially disposed along a second direction Y, wherein the first direction X intersects the second direction Y. The first power supply line 51, the data signal line 52, and the compensation signal line 53 may extend along the second direction Y and are respectively disposed along the first direction X.

In an exemplary embodiment, four data signal lines 52 and one compensation signal line 53 are disposed between two first power supply lines 51, two of the four data signal lines 52 are disposed between the compensation signal line 53 and one first power supply line 51, and the other two of the four data signal lines 52 are disposed between the compensation signal line 53 and the other first power supply line 51. Thus, four sub-pixels are formed between two first power supply lines 51 by providing four data signal lines 52 and one compensation signal line 53, and correspondingly, four sub-pixels are also formed between two compensation signal lines 53 by providing two first power supply lines 51 and four data signal lines 52.

In an exemplary embodiment, one first power supply line 51, two data signal lines 52, a compensation signal line 53, other two data signal lines 52, and another first power supply line 51 may be arranged in sequence along the first direction X. A first sub-pixel P1 is formed between a first power supply line 51 and a data signal line 52 adjacent to the first direction X, a second sub-pixel P2 is formed between the compensation signal line 53 and a data signal line 52 adjacent in the opposite direction of the first direction X, a third sub-pixel P3 is formed between the compensation signal line 53 and a data signal line 52 adjacent in the first direction X, and a fourth sub-pixel P4 is formed between the other first power supply line 51 and a data signal line 52 adjacent in the opposite direction of the first direction X.

In an exemplary embodiment, among the 4 sub-pixels of at least one pixel unit, the pixel drive circuit in each sub-pixel may include a first transistor T1, a second transistor T2, a third transistor T3 and a storage capacitor. The first transistor T1 may include a first active layer, a first gate electrode, a first source electrode, and a first drain electrode; the second transistor T2 may include a second active layer, a second gate electrode, a second source electrode, and a second drain electrode, the third transistor T3 may include a third active layer, a third gate electrode, a third source electrode, and a third drain electrode, and the storage capacitor may include a first electrode plate and a second electrode plate.

In an exemplary embodiment, in at least one sub-pixel, the first electrode plate of the storage capacitor may include a first housing surrounding at least one first opening, the second electrode plate of the storage capacitor may include a second bezel surrounding at least one second opening, and an orthographic projection of the second housing on the substrate is within the range of an orthographic projection of the first housing on the substrate, the orthographic projection of the first opening on the substrate is within the range of the orthographic projection of the second opening on the substrate, so that the first housing and the second housing form a capacitor housing surrounding at least one capacitor opening.

In an exemplary embodiment, an orthographic projection of the at least one capacitor opening on the substrate may be located within the range of an orthographic projection of the pixel opening on the substrate.

In an exemplary embodiment, the capacitor housing may include a first bezel, a second bezel, a third bezel, and a fourth bezel forming a ring, and at least one spacer bezel. The first bezel and the third bezel are oppositely arranged, and the second bezel and the fourth bezel are oppositely arranged. The first end of the at least one spacer bezel is connected to the first bezel, the second end of the spacer bezel is connected to the third bezel, and the at least one spacer bezel is configured to separate the capacitor opening surrounded by the capacitor housing.

In an exemplary embodiment, the orthographic projection of the ring storage capacitor on the substrate at least partially overlapping the orthographic projection of the pixel opening on the substrate may include any one or more of the following: the orthographic projection of the first bezel on the substrate is within the range of the orthographic projection of the pixel opening on the substrate, the orthographic projection of the second bezel on the substrate is within the range of the orthographic projection of the pixel opening on the substrate, the orthographic projection of the third bezel on the substrate is within the range of the orthographic projection of the pixel opening on the substrate, and the orthographic projection of the fourth bezel on the substrate is within the range of the orthographic projection of the pixel opening on the substrate.

In an exemplary embodiment, the orthographic projection of the ring storage capacitor on the substrate at least partially overlapping the orthographic projection of the pixel opening on the substrate may include any one or more of the following: an orthographic projection of an outer edge of the first bezel on the substrate substantially overlaps an orthographic projection of an edge of the pixel opening on the substrate, an orthographic projection of an outer edge of the second bezel on the substrate substantially overlaps an orthographic projection of an edge of the pixel opening on the substrate, an orthographic projection of the outer edge of the third bezel on the substrate substantially overlaps an orthographic projection of an edge of the pixel opening on the substrate, and an orthographic projection of the outer edge of the fourth bezel on the substrate substantially overlaps an orthographic projection of an edge of the pixel opening on the substrate.

In an exemplary embodiment, the number of capacitor openings in at least one sub-pixel may be plural, for example 2, 3, 4, or 5.

In an exemplary embodiment, in at least one sub-pixel, in a plane parallel to the substrate, the shape of the capacitor opening may include any one or more of the following: triangle, rectangle, trapezoid, parallelogram, pentagon, hexagon, circle and ellipse.

In an exemplary embodiment, the first electrode plate and the second electrode plate are transparent conductive layers forming a transparent ring storage capacitor.

In an exemplary embodiment, in at least one sub-pixel, multiple capacitor openings are sequentially disposed along the second direction Y.

In an exemplary embodiment, the number of capacitor openings in the first sub-pixel P1, the second sub-pixel P2, the third sub-pixel P3, and the fourth sub-pixel P4 may be the same or different.

In an exemplary embodiment, the number of capacitor openings in the first sub-pixel P1 is 5, the number of capacitor openings in the second sub-pixel P2 is 2, the number of capacitor openings in the third sub-pixel P3 is 3, and the number of capacitor openings in the fourth sub-pixel P4 is 4.

In an exemplary embodiment, a first scan signal line 41 is connected to a gate electrode of a first transistor T1 in each sub-pixel, a second scan signal line 42 is connected to a gate electrode of a third transistor T3 in each sub-pixel, a data signal line 52 is connected to a first electrode of the first transistor T1 in each sub-pixel, a compensation signal line 53 is connected to a first electrode of the third transistor T3 in each sub-pixel, a first power supply line 51 is connected to a first electrode of a second transistor T2 in each sub-pixel, a second electrode of the first transistor T1 in each sub-pixel is connected to a gate electrode of the second transistor T2, a second electrode of the second transistor T2 in each sub-pixel is connected to the first electrode of the third transistor T3 and an anode of the light emitting device, a first electrode plate in each sub-pixel is respectively connected to the second electrode of the second transistor T2 and a second electrode of the third transistor T3, and a second electrode plate in each sub-pixel is respectively connected to the second electrode of the first transistor T1 and the gate electrode of the second transistor T2.

In an exemplary embodiment, at least one pixel unit may include multiple connection lines, including at least two power supply connection lines 21 extending along the first direction X and two compensation connection lines 22 extending along the first direction X, thereby forming a one-for-two structure of the first power supply line and a one-for-four structure of the compensation signal line.

In an exemplary embodiment, a power supply connection line 21 is provided at the first sub-pixel P1 and the second sub-pixel P2, the first end of the power supply connection line 21 is connected to the first power supply line 51 in the first sub-pixel P1 through a via, and the second end of the power supply connection line 21 is connected to the second transistor T2 in the second sub-pixel P2 through a via. Another power supply connection line 21 is provided at the third sub-pixel P3 and the fourth sub-pixel P4. The first end of the power supply connection line 21 is connected to the first power supply line 51 in the fourth sub-pixel P4 through a via, and the second end of the power supply connection line 21 is connected to the second transistor T2 in the third sub-pixel P3 through a via. In this way, one first power supply line 51 can supply power signals to two sub-pixels.

In an exemplary embodiment, a compensation connection line 22 is provided at the first sub-pixel P1 and the second sub-pixel P2. The first end of the compensation connection line 22 is connected to the compensation signal line 53 through a via, and the second end of the compensation connection line 22 is connected to the third transistor T3 in the first sub-pixel P1 through a via. Another compensation connection line 22 is provided at the third sub-pixel P3 and the fourth sub-pixel P4. The first end of the compensation connection line 22 is connected to the compensation signal line 53 through a via, and the second end is connected to the third transistor T3 in the fourth sub-pixel P4 through a via. Thus one compensation signal line 53 can supply compensation signals to four sub-pixels.

The embodiment of the present disclosure saves the quantity of signal lines through the one-for-two structure of the first power supply lines and the one-for-four structure for the compensation signal lines, thereby reducing the space occupied, implementing a simple structure and a reasonable layout, making full use of the layout space, improving the space utilization rate, and being beneficial to improving the resolution.

In an exemplary embodiment, in a direction perpendicular to the display substrate, the drive circuit layer of the sub-pixel may include a first conductive layer, a second conductive layer, a first insulating layer, a semiconductor layer, a second conductive layer, a second insulating layer, a third conductive layer, a third insulating layer and a fourth conductive layer. The first conductive layer at least includes a first electrode plate of a storage capacitor, the second conductive layer at least includes a power supply connection line 21 and a compensation connection line 22, the semiconductor layer at least includes a second electrode plate of a storage capacitor and active layers of three transistors, the third conductive layer at least includes a first scan signal line 41, a second scan signal line 42 and gate electrodes of the three transistors, and the fourth conductive layer at least includes a first power supply line 51, a data signal line 52, a compensation signal line 53 and first and second electrodes of the three transistors. There is an overlapping region between an orthographic projection of the first electrode plate on the substrate and an orthographic projection of the second electrode plate on the substrate, thereby forming a storage capacitor C.

In an exemplary embodiment, the second conductive layer may include a shield layer disposed on the second conductive layer, and an orthographic projection of the active layer of the second transistor on the substrate is within the range of the orthographic projection of the shield layer on the substrate.

In an exemplary embodiment, multiple vias may be provided on the first scan signal line 41 and the second scan signal line 42, and the orthographic projection of the vias on the substrate at least partially overlaps the orthographic projection of the first power supply line 51, the data signal line 52 and the compensation signal line 53 on the substrate.

Exemplary description is made below through a process of manufacturing a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a substrate through a process such as depositing, coating, or the like. If the "thin film" does not need a patterning process in an entire preparation process, the "thin film" may also be referred to as a "layer". If the "thin film" needs the patterning process in the entire preparation process, it is called a "thin film" before the patterning process, and called a "layer" after the patterning process. The "layer" which has experienced the patterning process at least includes one "pattern". "A and B being arranged on the same layer" in the present disclosure means that A and B are formed simultaneously through a single patterning process, and the "thickness" of a film layer is the dimension of the film layer in a direction perpendicular to the display substrate. In an exemplary embodiment of the present disclosure, "an orthographic projection of B is within the range of an orthographic projection of A" or "an orthographic projection of A includes an orthographic projection of B" refers to the boundary of the orthographic projection of B falling within the boundary range of the orthographic projection of A, or the boundary of the orthographic projection of A overlaps with the boundary of the orthographic projection of B.

In an exemplary embodiment, taking four sub-pixels (first sub-pixel P1, second sub-pixel P2, third sub-pixel P3, and fourth sub-pixel P4) as an example, the preparation process of the drive circuit layer may include the following operations.

Figure 6A:
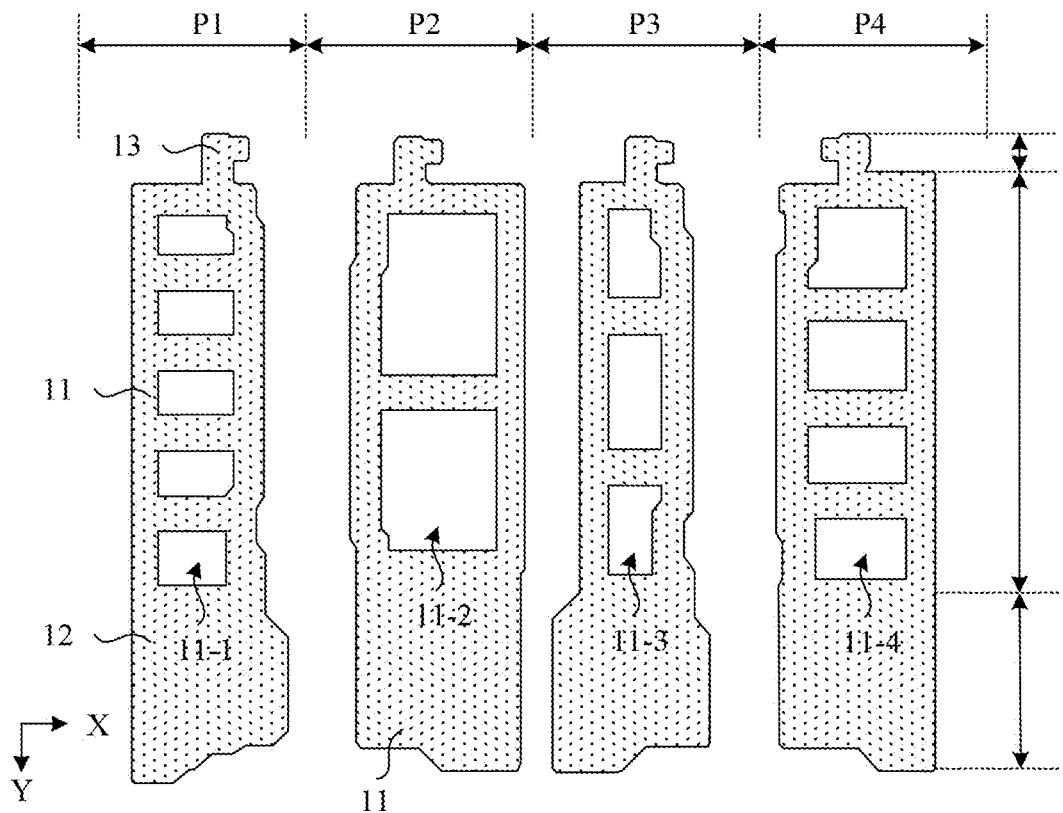
FIG. 6a is a schematic diagram after a pattern of a first conductive layer is formed according to an exemplary embodiment of the present disclosure.
Figure 6B:
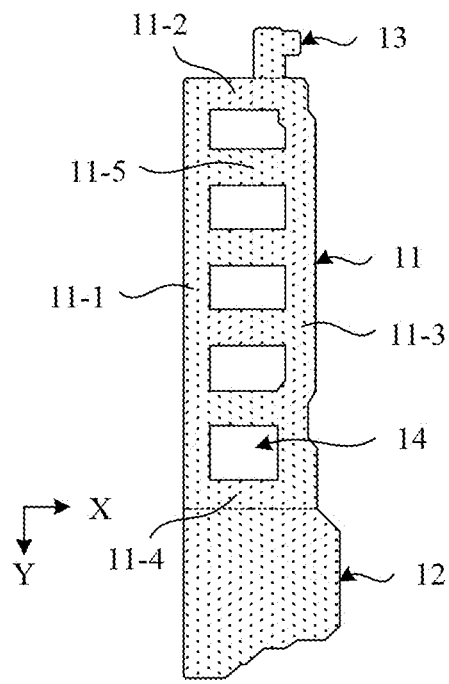

(1) A first conductive layer pattern is formed. In an exemplary embodiment, forming the first conductive layer pattern may include: depositing a first conductive film on a substrate, patterning the first conductive film through a patterning process to form a first conductive layer pattern on the substrate, wherein the first conductive layer pattern at least includes a first electrode plate 11, a circuit part 12, and a connection part 13 formed in each sub-pixel, as shown in FIGS. 6a and 6a, where FIG. 6b is a schematic plan view of the first conductive layer in one of the sub-pixels in FIG. 6a. In an exemplary embodiment, a first conductive layer may be referred to as a first transparent (ITO1) layer.

In an exemplary embodiment, the first electrode plate 11 in each sub-pixel is configured as a transparent electrode plate forming a storage capacitor, the first electrode plate 11 has a ring structure, the outer contour of the ring structure may be rectangular in shape, the corners of the rectangular shape may be chamfered, and the edges of the rectangular shape may be polylines.

In an exemplary embodiment, a circuit part 12 in each sub-pixel may be provided on one side of the first electrode plate 11 in the second direction Y and connected to the first electrode plate 11, the circuit part 12 may be polygonal in shape, and the circuit part 12 is configured to be connected to a shield layer formed subsequently.

In an exemplary embodiment, the connection part 13 in each sub-pixel may be provided on one side opposite to the second direction Y of the first electrode plate 11 and connected to the first electrode plate 11, the connection part 13 may be polygonal in shape, and the connection part 13 is configured to be connected to the interlayer connection electrodes formed subsequently.

In an exemplary embodiment, the first electrode plate 11 the circuit part 12 and the connection part 13 may be of an integral structure connected to each other.

In an exemplary embodiment, the first electrode plate 11 of the ring structure may include a first side 11-1, a second side 11-2, a third side 11-3 and a fourth side 11-4 constituting a ring shape; the first side 11-1 and the third side 11-3 are disposed opposite each other, and the second side 11-2 and the fourth side 11-4 are disposed opposite each other. A second end of the second side 11-2 extends along a first direction X and is connected to the first end of the third side 11-3, a second end of the third side 11-3 extends in a second direction Y and is connected to the first end of the fourth side 11-4, a second end of the fourth side 11-4 extends in the opposite direction of the first direction X and is connected to a first end of the first side 11-1, a second end of the first side 11-1 extends in the opposite direction of the second direction Y and is connected to the first end of the second side 11-2, i.e. the first side 11-1, the second side 11-2, the third side 11-3 and the fourth side 11-4 are connected in sequence to form a first housing surrounding at least one first opening 14, and the first direction X intersects the second direction Y.

In an exemplary embodiment, the first electrode plate 11 may further include at least one spacer side 11-5. The first end of the spacer side 11-5 is connected to the first side 11-1, and the second end of the spacer side 11-5 is connected to the third side 11-3. The spacer side 11-5 is configured to partition a space surrounded by the first housing such that the first housing surrounds multiple first openings 14, which are arranged in sequence in the second direction Y.

In an exemplary embodiment, the main parts of the first side 11-1 and the third side 11-3 may be arranged in parallel, both extending in the first direction X, and the main parts of the second side 11-2 and the fourth side 11-4 may be arranged in parallel, both extending in the second direction Y, so that the shape of the outer contour of the first housing is rectangular. In an exemplary embodiment, the corners of outer contour of the first housing may be chamfered, and the edges of the outer contour of the first housing may be polylines or arcs.

In an exemplary embodiment, the first side 11-1 and the third side 11-3 may have a same or different widths, which is are dimensions of the first direction X. The second side 11-2 and the fourth side 11-4 may have same or different widths, which are the dimensions of the second direction Y.

In an exemplary embodiment, the main part of the at least one spacer side 11-5 may be parallel to the second side 11-2 or the fourth side 11-4, or the main part of the at least one spacer side 11-5 may intersect the second side 11-2 or the fourth side 11-4.

In an exemplary embodiment, the first electrode plate 11 may include multiple spacer sides 11-5 which may be arranged in parallel.

In an exemplary embodiment, the widths of the multiple spacer sides 11-5 may be the same or different, where the widths of the spacer sides are dimensions in the second direction Y.

In an exemplary embodiment, the shapes of the multiple first openings 14 may be the same or different, and the areas of the multiple first openings 14 may be the same or different.

In an exemplary embodiment, the shape of the first opening 14 may include any one or more of the following: triangle, rectangle, trapezoid, parallelogram, pentagon, hexagon, circle and ellipse.

In an exemplary embodiment, the number of the first housing surrounding the first opening 14 in the first sub-pixel P1, the second sub-pixel P2, the third sub-pixel P3, and the fourth sub-pixel P4 may be the same or different. For example, the first electrode plate 11 in the first sub-pixel P1 may include four spacer sides 11-5 such that the first housing surrounds five first openings 14. As another example, the first electrode plate 11 in the second sub-pixel P2 may include two spacer sides 11-5 such that the first housing surrounds the two first openings 14. For another example, the first electrode plate 11 in the third sub-pixel P3 may include three spacer sides 11-5 such that the first housing surrounds the three first openings 14. For another example, the first electrode plate 11 in the fourth sub-pixel P4 may include four spacer sides 11-5 such that the first housing surrounds the four first openings 14.

In an exemplary embodiment, the shape and area of the first housing surrounding the multiple first openings 14 in the first sub-pixel P1, the second sub-pixel P2, the third sub-pixel P3 and the fourth sub-pixel P4 may be the same or different, and the present disclosure is not limited herein.

Figure 6C:
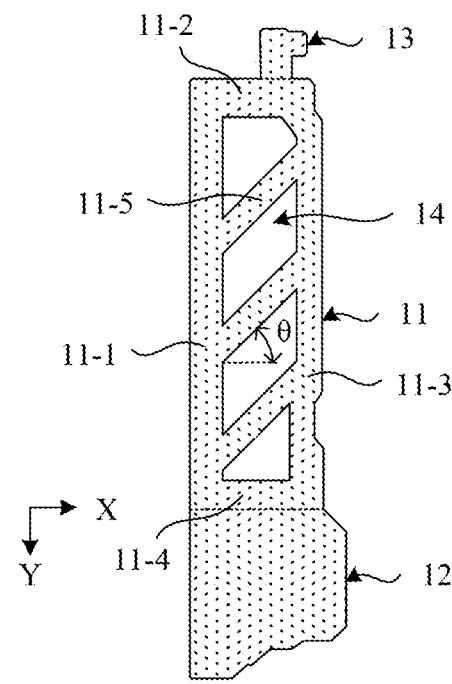

FIG. 6c is a schematic plan view of another first conductive layer in a sub-pixel of FIG. 6a. As shown in FIG. 6C, the main parts of the first side 11-1 and the third side 11-3 may extend along the first direction X, the main parts of the second side 11-2 and the fourth side 11-4 may extend along the second direction Y, the main parts of the multiple spacer sides 11-5 are parallel to each other and extend along a direction having an included angle θ with the first direction X, and the multiple first openings 14 include triangles, parallelograms and polygons. In an exemplary implementation mode, the included angle θ may be greater than 0 degrees and less than 90 degrees.

In an exemplary embodiment, the first end of at least one spacer side 11-5 may be connected to the second side 11-2, and the second end may be connected to the fourth side 11-4, such that the first housing surrounds multiple first openings 14 arranged in sequence along the first direction X, and the present disclosure is not limited thereto.

Figure 7A:
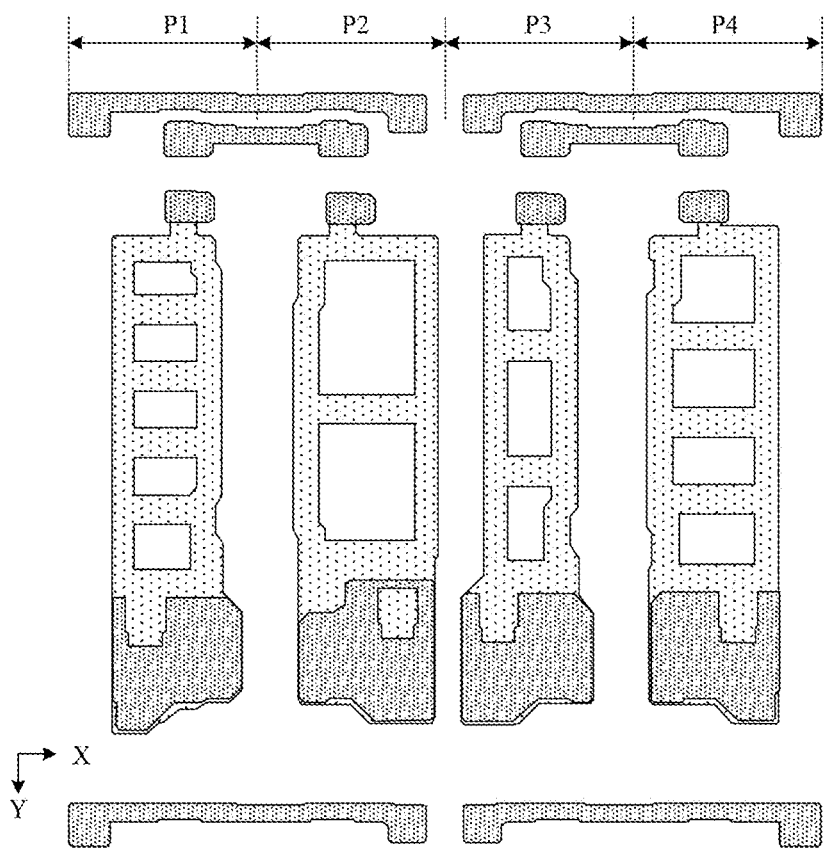
FIG. 7a is a schematic diagram after a pattern of a second conductive layer is formed according to an exemplary embodiment of the present disclosure.
Figure 7B:
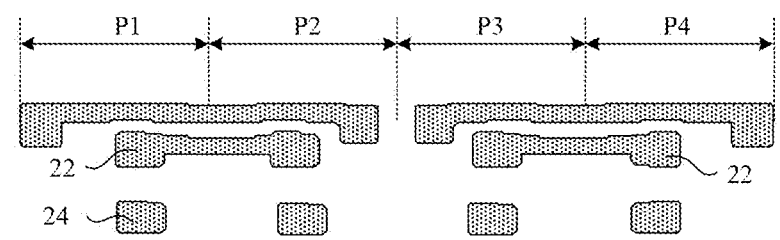
Figure 7B:
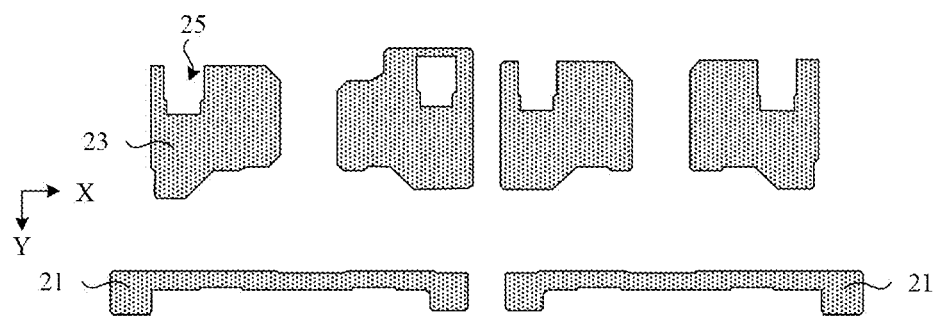

(2) A second conductive layer pattern is formed. In an exemplary embodiment, forming the second conductive layer pattern may include: depositing a second conductive film on the substrate, patterning the second conductive thin film through a patterning process to form the second conductive layer pattern on the substrate. The conductive layer pattern at least includes a power supply connection line 21, a compensation connection line 22, a shield layer 23 and an interlayer connection electrode 24 formed in each sub-pixel, as shown in FIGS. 7a and 7b, where FIG. 7b is a schematic plan view of the second conductive layer in FIG. 7a. In an exemplary embodiment, the second conductive layer may be referred to as a shield metal (SHL) layer.

In the exemplary embodiment, the two power supply connection lines 21 have strip-shaped structures extending along the first direction X and are arranged in sequence along the first direction X. Two power supply connection lines 21 are located on the side of the first electrode plate 11 in the second direction Y, one power supply connection line 21 is provided across the first sub-pixel P1 and the second sub-pixel P2, and the other power supply connection line 21 is provided across the third sub-pixel P3 and the fourth sub-pixel P3. The two power supply connection lines 21 are configured to be respectively connected to the first power supply line formed subsequently and to supply power supply voltages to the second transistors T2 of the second sub-pixel P2 and the third sub-pixel P3, respectively.

In an exemplary embodiment, the two compensation connection lines 22 have strip-shaped structures extending along the first direction X and are arranged in sequence along the first direction X. The two compensation connection lines 22 are located on the opposite side of the second direction Y of the first electrode plate 11. One compensation connection line 22 is provided across the first sub-pixel P1 and the second sub-pixel P2, and the other compensation connection line 22 is provided across the third sub-pixel P3 and the fourth sub-pixel P4. The two compensation connection lines 22 are configured to be respectively connected to the compensation signal lines formed subsequently, and to supply compensation voltages to the third transistors T3 of the first sub-pixel P1 and the fourth sub-pixel P4, respectively.

In an exemplary embodiment, the shield layer 23 may be provided at each sub-pixel, an orthographic projection of the shield layer 23 on the substrate at least partially overlaps an orthographic projection of the circuit part 12 on the substrate, and the shield layer 23 is connected to the circuit part 12.

In the exemplary embodiment, each shield layer 23 is provided with a shield opening 25, and the shield layer 23 in the shield opening 25 is removed to expose the surface of the circuit part 12. The shield opening 25 is configured to accommodate a subsequently formed fourth via, which is located in the shield opening 25 and exposes the circuit part 12, so that the second electrode of the second transistor T2 formed subsequently is connected to the circuit part 12 through the via.

In an exemplary embodiment, the interlayer connection electrode 24 may be provided at each sub-pixel, an orthographic projection of the interlayer connection electrode 24 on the substrate at least partially overlaps an orthographic projection of the connection part 13 on the substrate, and the interlayer connection electrode 24 is connected to the connection part 13. The interlayer connection electrode 24 is configured to be connected to the second electrode of the third transistor T3 which is subsequently formed.

Figure 8A:
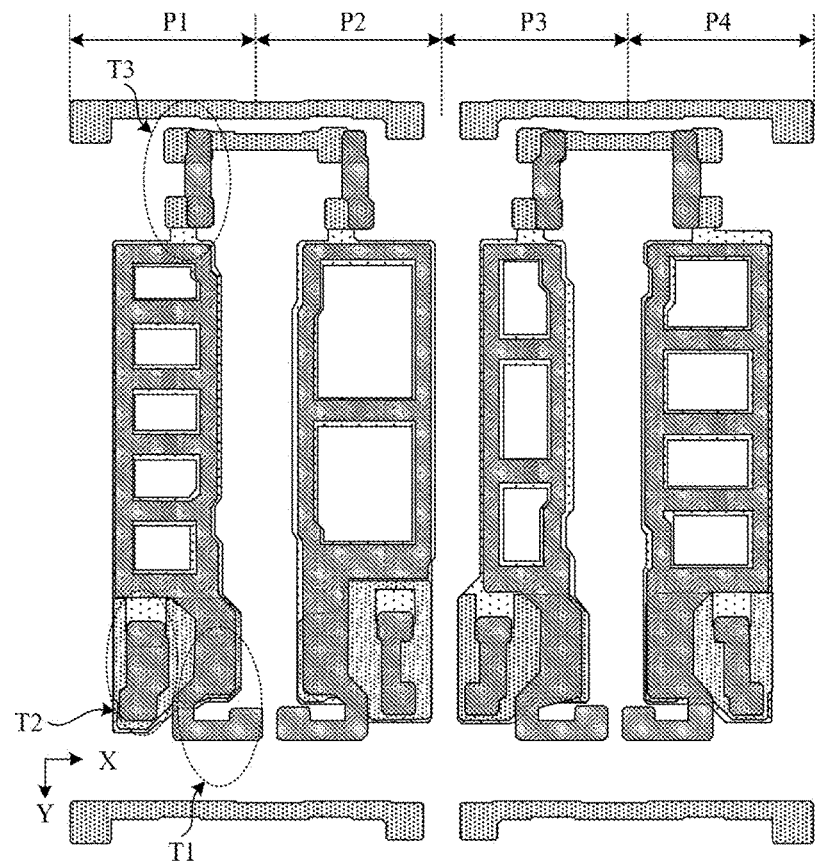
FIG. 8a is a schematic diagram after a pattern of a semiconductor layer is formed according to an exemplary embodiment of the present disclosure.
Figure 8B:
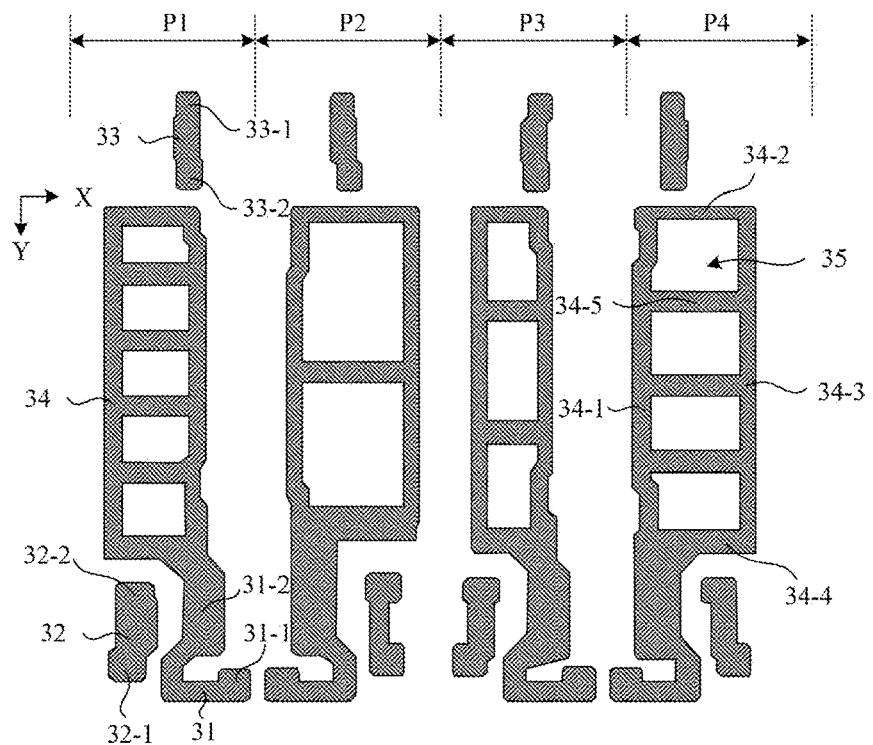

(3) A semiconductor layer pattern is formed. In an exemplary embodiment, forming a semiconductor layer pattern may include: sequentially depositing a first insulating film and a semiconductor film on the substrate, and patterning the semiconductor film through a patterning process to form a first insulating layer covering the second conductive layer and a semiconductor layer pattern disposed on the first insulating layer. The semiconductor layer pattern at least includes a first active layer 31, a second active layer 32, a third active layer 33 and a second electrode plate 34 formed in each sub-pixel, as shown in FIGS. 8A and 8b, where FIG. 8b is a schematic plan view of the semiconductor layer in FIG. 8a.

In an exemplary embodiment, there is an overlapping region between an orthographic projection of the second electrode plate 34 on the substrate and an orthographic projection of the first electrode plate 11 on the substrate in each sub-pixel, the second electrode plate 34 is configured as another transparent electrode plate that forms a storage capacitor, and the first electrode plate 11 and the second electrode plate 34 form a transparent storage capacitor.

In an exemplary embodiment, the second electrode plate 34 is a ring structure, the outer contour of the ring structure may be rectangular in shape, the corners of the rectangular shape may be chamfered, and the edges of the rectangular shape may be polylines.

In an exemplary embodiment, the second electrode plate 34 of the ring structure may include a first frame 34-1, a second frame 34-2, a third frame 34-3 and a fourth frame 34-4 constituting a ring shape; the first frame 34-1 and the third frame 34-3 are disposed opposite to each other, and the second frame 34-2 and the fourth frame 34-4 are disposed opposite to each other. A second end of the second frame 34-2 extends along a first direction X and is connected to a first end of the third frame 34-3, a second end of the third frame 34-3 extends in a second direction Y and is connected to a first end of the fourth frame 34-4, a second end of the fourth frame 34-4 extends in the opposite direction of the first direction X and is connected to a first end of the first frame 34-1, a second end of the first frame 34-1 extends in the opposite direction of the second direction Y and is connected to a first end of the second frame 34-2, that is, the first frame 34-1, the second frame 34-2, the third frame 34-3 and the fourth frame 34-4 are connected in sequence to form a second housing surrounding at least one second opening 35.

In an exemplary embodiment, the second electrode plate 34 may further include at least one spacer frame 34-5. The first end of the spacer frame 34-5 is connected to the first frame 34-1, and the second end of the spacer frame 34-5 is connected to the third frame 34-3. The spacer frame 34-5 is configured to partition a space surrounded by the second bezel such that the second housing surrounds multiple second openings 35, which are sequentially disposed in the second direction Y.

In an exemplary embodiment, the main parts of the first frame 34-1 and the third frame 34-3 may be arranged in parallel, both extending in the first direction X, and the main parts of the second frame 34-2 and the fourth frame 34-4 may be arranged in parallel, both extending in the second direction Y, so that the shape of the outer contour of the second housing is rectangular. In an exemplary embodiment, the corners of outer contour of the second housing may be chamfered, and the edges of the outer contour of the second housing may be polylines or arcs.

In an exemplary embodiment, the first frame 34-1 and the third frame 34-3 may have a same or different widths, which are the dimensions of the first direction X. The second frame 34-2 and the fourth frame 34-4 may have same or different widths, which are the dimensions of the second direction Y.

In an exemplary embodiment, the main part of the at least one spacer frame 34-5 may be parallel to the second frame 34-2 or the fourth frame 34-4, or the main part of the at least one spacer frame 34-5 may intersect the second frame 34-2 or the fourth frame 34-4.

In an exemplary embodiment, the second electrode plate 34 may include multiple spacer frames 34-5 which may be arranged in parallel.

In an exemplary embodiment, the widths of the multiple spacer frames 34-5 may be the same or different, where the widths of the spacer frame are dimensions in the second direction Y.

In an exemplary embodiment, the shapes of the multiple second openings 35 may be the same or different, and the areas of the multiple second openings 35 may be the same or different.

In an exemplary embodiment, the shape of the second opening 35 may include any one or more of the following:

triangular, rectangular, trapezoidal, parallel four-frame, five-frame, six-frame, round, and oval.

In an exemplary embodiment, the number of the second housing surrounding the second opening 35 in the first sub-pixel P1, the second sub-pixel P2, the third sub-pixel P3, and the fourth sub-pixel P4 may be the same or different. For example, the second electrode plate 34 in the first sub-pixel P1 may include four spacer frames 34-5 such that the second housing surrounds five second openings 35. As another example, the second electrode plate 34 in the second sub-pixel P2 may include two spacer frames 34-5 such that the second housing surrounds two second openings 35. For another example, the second electrode plate 34 in the third sub-pixel P3 may include three spacer frames 34-5 such that the second housing surrounds three second openings 35. For another example, the second electrode plate 34 in the fourth sub-pixel P4 may include four spacer frames 34-5 such that the second housing surrounds four second openings 35.

In an exemplary embodiment, the shape and area of the second housing surrounding the multiple second openings 35 in the first sub-pixel P1, the second sub-pixel P2, the third sub-pixel P3 and the fourth sub-pixel P4 may be the same or different, and the present disclosure is not limited herein.

In an exemplary embodiment, in each sub-pixel, the shape of the second electrode plate 34 may be similar to the shape of the first electrode plate 11 in the sub-pixel, and an orthographic projection of the second electrode plate 34 on the substrate is within the range of an orthographic projection of the first electrode plate 11 on the substrate.

In an exemplary embodiment, an orthographic projection of the second electrode plate 34 on the substrate being within the range of an orthographic projection of the first electrode plate 11 on the substrate may include: an orthographic projection of the first frame of the second electrode plate 34 on the substrate is within the range of an orthographic projection of the first side of the first electrode plate 11 on the substrate, an orthographic projection of the second frame of the second electrode plate 34 on the substrate is within the range of an orthographic projection of the second side of the first electrode plate 11 on the substrate, an orthographic projection of the third frame of the second electrode plate 34 on the substrate is within the range of an orthographic projection of the third side on the first electrode plate 11 on the substrate, an orthographic projection of the fourth frame of the second electrode plate 34 on the substrate is within the range of an orthographic projection of the fourth side of the first electrode plate 11 on the substrate, an orthographic projection of the spacer frame of the second electrode plate 34 on the substrate is within the range of an orthographic projection of the spacer side of the first electrode plate 11 on the substrate, and an orthographic projection of the first opening of the first electrode plate 11 on the substrate is within the range of an orthographic projection of the second opening of the second electrode plate 34 on the substrate.

In an exemplary embodiment, the transparent ring storage capacitor formed by the first electrode plate 11 and the second electrode plate 34 may include a capacitor housing forming a ring, the capacitor housing surrounds at least one capacitor opening, the capacitor housing may include a stacked first housing and second housing, and the capacitor opening may include a stacked first opening and second opening.

In an exemplary embodiment, the capacitor housing may include a first bezel, a second bezel, a third bezel, and a fourth bezel forming a ring, and at least one spacer bezel. The first bezel may include a stacked first side and a first frame, the second bezel may include a stacked second side and a stacked second frame, the third bezel may include a stacked third side and a stacked third frame, the fourth bezel may include a stacked fourth side and a stacked fourth frame, and the spacer bezel may include a stacked spacer side and a spacer frame.

In an exemplary embodiment, the shape of the outer contour of the capacitor housing may be a rectangular shape, the corners of the rectangular shape may be chamfered, and the edges of the rectangular shape may be polylines or arcs.

In an exemplary embodiment, the widths of the first and the third bezel may be the same or different, the widths of the second and the fourth bezel may be the same or different, and the widths of the multiple spacer bezels may be the same or different.

In an exemplary embodiment, the main part of the at least one spacer bezel may be parallel to the second bezel or the fourth bezel, or the main part of the at least one spacer bezel may cross the second bezel or the fourth bezel.

In an exemplary embodiment, the shapes of the multiple capacitor openings may be the same or different, and the areas of the multiple capacitor openings may be the same or different.

In an exemplary embodiment, the shape of the capacitor opening may include any one or more of the following: triangular, rectangular, trapezoidal, parallel four-frame, five-frame, six-frame, round, and oval.

In an exemplary embodiment, the transparent ring storage capacitor may be divided into a fully transparent region and a non-fully transparent region. The region where the capacitor housing is located may be referred to as a non-fully transparent region due to the superimposed first housing and the second housing, and the region where the capacitor opening is located may be referred to as a fully transparent region due to the absence of the first housing and the second housing. When light passes through the non-fully transparent region, some light will be lost.

In an exemplary embodiment, the ratio of the area of an orthographic projection of the capacitor housing on the substrate to the area of an orthographic projection of the capacitor opening on the substrate may be about 0.8 to 1.2.

In an exemplary embodiment, the ratio of the area of the orthographic projection of the capacitor housing on the substrate to the area of the orthographic projection of the capacitor opening on the substrate may be about 0.8 to 1.2.

In an exemplary embodiment, the area of the orthographic projection of the capacitor housing on the substrate may be the sum of the areas of the orthographic projections of the of the first bezel, the second bezel, the third bezel, the fourth bezel and the multiple spacer bezels on the substrate, and the area of the orthographic projection of the capacitor opening on the substrate may be the sum of the areas of the orthographic projections of the multiple capacitor openings on the substrate.

In an exemplary embodiment, the first active layer 31 is used as an active layer of the first transistor T1, the second active layer 32 is used as an active layer of the second transistor T2, and the third active layer 33 is used as an active layer of the third transistor T3. The first active layer 31, the second active layer 32, and the third active layer 33 each include a channel region and first and second regions disposed on both sides of the channel region.

In an exemplary embodiment, the shape of the first active layer 31 may be an "L" shape, and the first active layer 31 may be located on one side of the second direction Y of the second electrode plate 34. A first region 31-1 of the first active layer 31 is located on a side of the channel region away from the second electrode plate 34, a second region 31-2 of the first active layer 31 is located on a side of the channel region close to the second electrode plate 34, and an orthographic projection of the second region 31-2 of the first active layer 31 on the substrate at least partially overlaps an orthographic projection of the shield layer 23 on the substrate.

In an exemplary embodiment, the second region 31-2 of the first active layer 31 may be connected to the second electrode plate 34, and the first active layer 31 and the second electrode plate 34 are of an integral structure connected to each other.

In an exemplary embodiment, the second region 31-2 of the first active layer 31 in the first sub-pixel P1 and the third sub-pixel P3 is in a polyline shape extending along the second direction D2, and the polyline shape protrudes toward adjacent sub-pixels. A polyline shape in the first sub-pixel P1 protrudes toward the second sub-pixel P2, and a polyline shape in the third sub-pixel P31 protrudes toward the fourth sub-pixel P4. Since the second region 31-2 of the first active layer 31 is connected to the second gate electrode through the second electrode of the first transistor T1 which is subsequently formed, interconnection between the second electrode of the first transistor T1, the second gate electrode and the second electrode plate of the storage capacitor is achieved, so that the connection structure of the first transistor T1 and the storage capacitor in the first sub-pixel P1 and the third sub-pixel P3 is a bend structure protruding towards adjacent sub-pixels.

In an exemplary embodiment, the shape of the second active layer 32 may be an "I" shape, and the second active layer 32 may be located on one side of the second direction Y of the second electrode plate 34. The orthographic projection of the second active layer 32 on the substrate and the orthographic projection of the second electrode plate 34 on the substrate are arranged at intervals, that is, there is no overlapping region between the second active layer 32 and the second electrode plate 42, which is beneficial to design the channel width to length ratio of the second transistor according to the relevant requirements. A first region 32-1 of the second active layer 32 is located on a side of the channel region away from the second electrode plate 34 and is within the shield opening 25, an orthographic projection of a part of the first region 32-1 of the second active layer 32 near the channel region on the substrate overlaps an orthographic projection of the shield layer 23 on the substrate, and an orthographic projection of a part of the first region 32-1 of the second active layer 32 away from the channel region on the substrate overlaps an orthographic projection of the circuit part 12 on the substrate. The second region 32-2 of the second active layer 32 is located on a side of the channel region near the second electrode plate 34, and there is an overlapping region between an orthographic projection of the second region 32-2 of the second active layer 32 on the substrate and an orthographic projection of the shield layer 23 on the substrate. In this way, the shield layer 23 can shield the channel region of the second active layer 32 to avoid the influence of light on the channel and reduce the leakage current, thereby avoiding the influence of light on the transistor characteristics.

In an exemplary embodiment, the third active layer 33 may have an "I" shape and may be located on the opposite side of the second direction Y of the second electrode plate 34. The orthographic projection of the third active layer 33 on the substrate and the orthographic projection of the second electrode plate 34 on the substrate are arranged at intervals, that is, there is no overlapping region between the third active layer 33 and the second electrode plate 42, which is beneficial to design the channel width to length ratio of the third transistor according to the relevant requirements. The first region 33-1 of the third active layer 33 is located on the side of the channel region away from the second electrode plate 34, and there is an overlapping region between an orthographic projection of the first region 33-1 of the third active layer 33 on the substrate and an orthographic projection of the compensation connection line 22 on the substrate. The second region 33-2 of the third active layer 33 is located on a side of the channel region near the second electrode plate 34, and there is an overlapping region between an orthographic projection of the second region 33-2 of the third active layer 33 on the substrate and an orthographic projection of the interlayer connection electrode 24 on the substrate.

In an exemplary embodiment, the semiconductor layer may be made of metal oxides such as oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, oxides containing indium, gallium and zinc, etc. The semiconductor layer may be a single layer, two layers, or multiple layers.

Figure 9A:
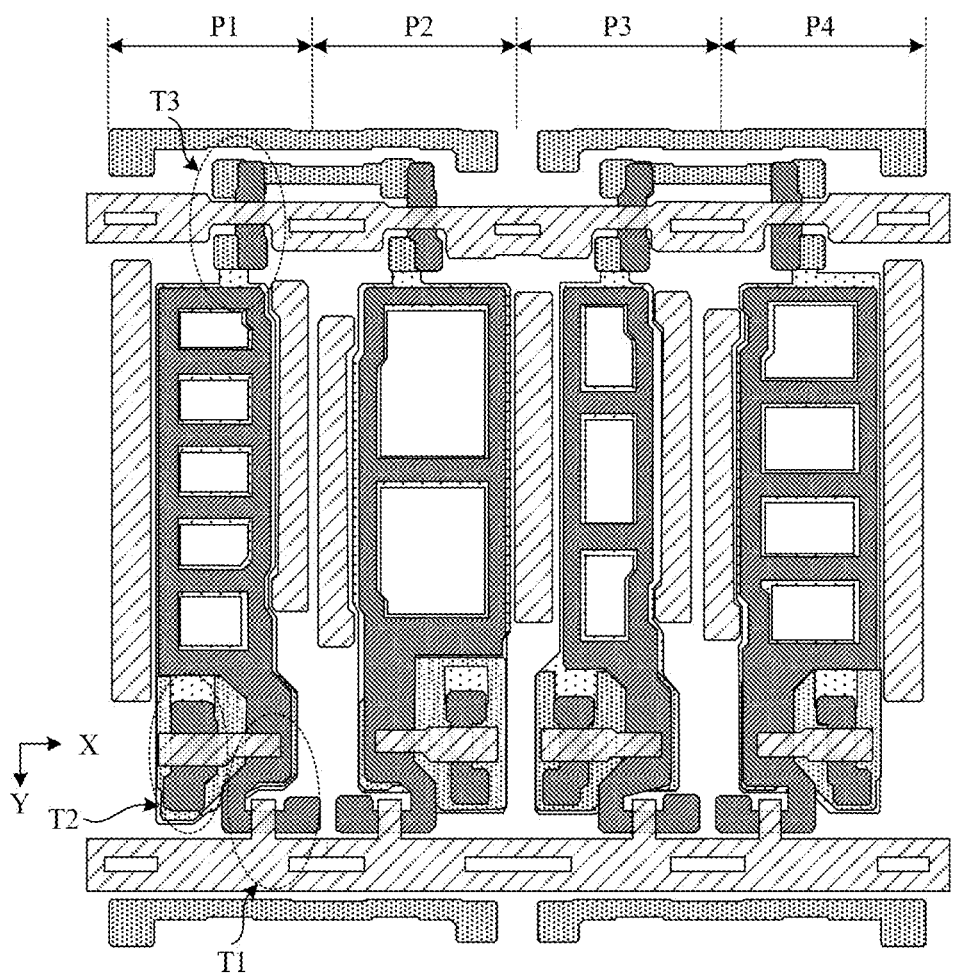
FIG. 9a is a schematic diagram after a pattern of a third conductive layer is formed according to an exemplary embodiment of the present disclosure.
Figure 9B:
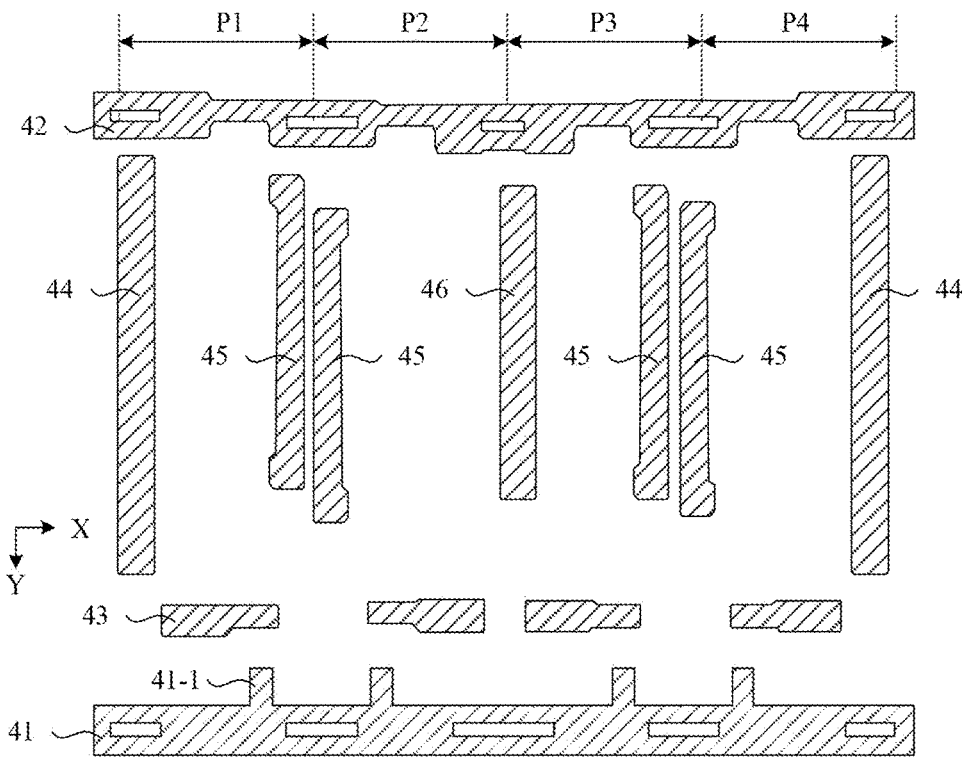

(4) A third conductive layer pattern is formed. In exemplary embodiments, forming the third conductive layer pattern may include: sequentially depositing a second insulating film and a third conductive film on the substrate, and patterning the third conductive film through a patterning process to form a second insulating layer covering the semiconductor layer and a third conductive film pattern disposed on the second insulating layer. The third conductive layer pattern at least includes a first scan signal line 41, a second scan signal line 42, a second gate electrode 43, an auxiliary power supply line 44, an auxiliary data line 45 and an auxiliary compensation line 46, as shown in FIGS. 9a and 9b, where FIG. 9b is a schematic plan view of the third conductive layer in FIG. 9a. In an exemplary embodiment, the third conductive layer may be referred to as a gate metal (GATE) layer.

In the exemplary embodiment, the first scan signal line 41 is a strip-shaped structure extending along the first direction X and is located on the side of the second electrode plate 34 in the second direction Y. A first scan signal line 41 is provided across a first sub-pixel P1 to a fourth sub-pixel P4 and a first gate electrode 41-1 is provided on the first scan signal line 41 of each sub-pixel. The first gate electrode 41-1 is used as a gate electrode of the first transistor T1, and an orthographic projection of the first gate electrode 41-1 on a substrate overlaps an orthographic projection of the first active layer 31 on the substrate.

In an exemplary embodiment, the first scan signal line 41 may be arranged with equal widths, and a width of the first scan signal line 21 is a dimension of in the second direction Y. Multiple vias may be provided on the first scan signal line 41, the orthographic projections of the multiple vias on the substrate overlap the orthographic projections of the first power supply line, the data signal line and the compensation signal line formed subsequently on the substrate, and the multiple vias are configured to reduce parasitic capacitance between the first scan signal line 41 and the first power supply line, the data signal line and the compensation signal line.

In the exemplary embodiment, the second scan signal line 42 is a strip-shaped structure extending along the first direction X and is located on the opposite side of the second direction Y of the second electrode plate 34. A second scan signal line 42 is provided across the first sub-pixel P1 to the fourth sub-pixel P4. There is an overlapping region between an orthographic projection of the second scan signal line 42 on the substrate and an orthographic projection of the third active layer 33 on the substrate in each sub-pixel. The second scan signal line 42 in the overlapping region is used as a gate electrode of the third transistor T3.

In an exemplary embodiment, the second scan signal line 42 may be arranged with unequal widths, and a width of the second scan signal line 42 is a dimension of in the second direction Y. The second scan signal line 42 includes a region overlapping with the third active layer 33 and a region not overlapping with the third active layer 33. The width of the second scan signal line 42 in the region overlapping the third active layer 33 may be smaller than the width of the second scan signal line 42 in the region not overlapping the third active layer 33. In a region that not overlapping the third active layer 33, Multiple vias may be provided on the second scan signal line 42, the orthographic projections of the multiple vias on the substrate overlap the orthographic projections of the first power supply line, the data signal line and the compensation signal line formed subsequently on the substrate, and the multiple vias are configured to reduce parasitic capacitance between the second scan signal line 42 and the first power supply line, the data signal line and the compensation signal line.

In an exemplary embodiment, the area of the via orthogonally projected on the substrate may be smaller than the area of the capacitor opening orthogonally projected on the substrate.

In an exemplary embodiment, the first scan signal lines 41 and the second scan signal lines 42 may be arranged in parallel.

In the exemplary embodiment, a second gate electrode 43 is formed within each sub-pixel as a gate electrode of the second transistor T2. Within each sub-pixel, on the one hand, an orthographic projection of the second gate electrode 43 on the substrate overlaps an orthographic projection of the second active layer 32 on the substrate, and on the other hand, an orthographic projection of the second gate electrode 43 on the substrate overlaps the second region 31-2 of the first active layer 31.

In the exemplary embodiment, the auxiliary power supply line 44 is formed within the first sub-pixel P1 and the fourth sub-pixel P4, and is in a strip-shaped structure extending along the second direction Y. In the first sub-pixel P1, the auxiliary power supply line 44 is located on the opposite side of the first direction X of the second electrode plate 34. In the fourth sub-pixel P4, the auxiliary power supply line 44 is located on the side of the second electrode plate 34 in the first direction X. The auxiliary power supply line 44 is configured to be connected to the first power supply line formed subsequently to form a double-layer trace to ensure reliability of power signal transmission and to reduce resistance of the first power supply line.

In an exemplary embodiment, the auxiliary data lines 45 are formed within each sub-pixel in a strip structure extending along the second direction Y. In the first sub-pixel P1 and the third sub-pixel P3, the auxiliary data lines 45 are located on the side of the second electrode plate 34 in the first direction X. In the second sub-pixel P2 and the fourth sub-pixel P4, the auxiliary data lines 45 are located on the opposite side of the first direction X of the second electrode plate 34. The auxiliary data line 45 is configured to be connected to the data signal line formed subsequently to form a double-layer trace to ensure reliability of data signal transmission and to reduce resistance of the data signal line.

In the exemplary embodiment, the auxiliary compensation line 46 is formed between the second sub-pixel P2 and the third sub-pixel P3, and is in a strip-shaped structure extending along the second direction Y. The auxiliary compensation line 46 is configured to be connected to the compensation signal line formed subsequently to form a double-layer trace ensuring reliability of the compensation signal transmission and reducing the resistance of the compensation signal line.

In an exemplary embodiment, the second gate electrodes 43 in the first sub-pixel P1 and the fourth sub-pixel P4 may be mirror-symmetrically arranged with respect to the vertical axis (auxiliary compensation line 46), the second gate electrodes 43 in the second sub-pixel P2 and the third sub-pixel P3 may be mirror-symmetrically arranged with respect to the vertical axis, the auxiliary power supply lines 44 in the first sub-pixel P1 and the fourth sub-pixel P4 may be mirror-symmetrically arranged with respect to the vertical axis, the first scan signal line 41 may be mirror-symmetrically arranged with respect to the vertical axis, and the second scan signal line 42 may be mirror-symmetrically arranged with respect to the vertical axis.

In an exemplary embodiment, the main parts of the auxiliary power supply line 44, the auxiliary data line 45 and the auxiliary compensation line 46 may be arranged in parallel.

In an exemplary implementation, this process further includes a metallization process. Conduction treatment is to use a third conductive layer as a shield to perform plasma treatment after the third conductive layer pattern is formed. The semiconductor layer in the region shielded by the first gate electrode, the second gate electrode and the third gate electrode is used as the channel region of the transistor, the semiconductor layer in the region not shielded by the third conductive layer is processed into a conductive layer to form a conductive second electrode plate 34 and a conductive source and drain regions.

Figure 10A:
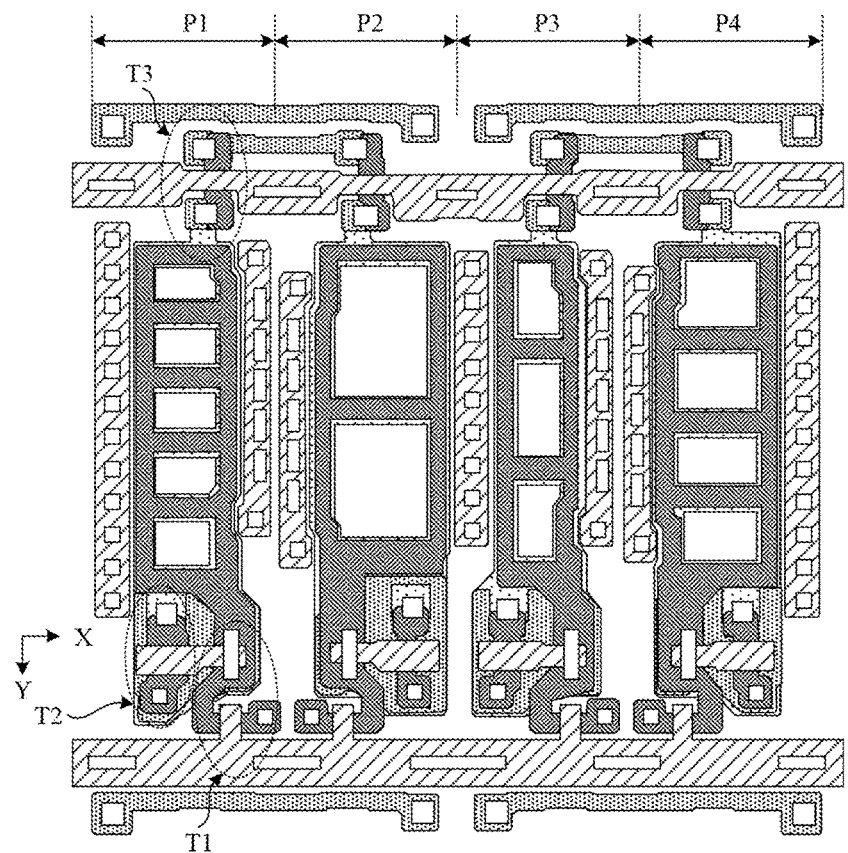
FIG. 10a is a schematic diagram after a pattern of a third insulating layer is formed according to an exemplary embodiment of the present disclosure.
Figure 10B:
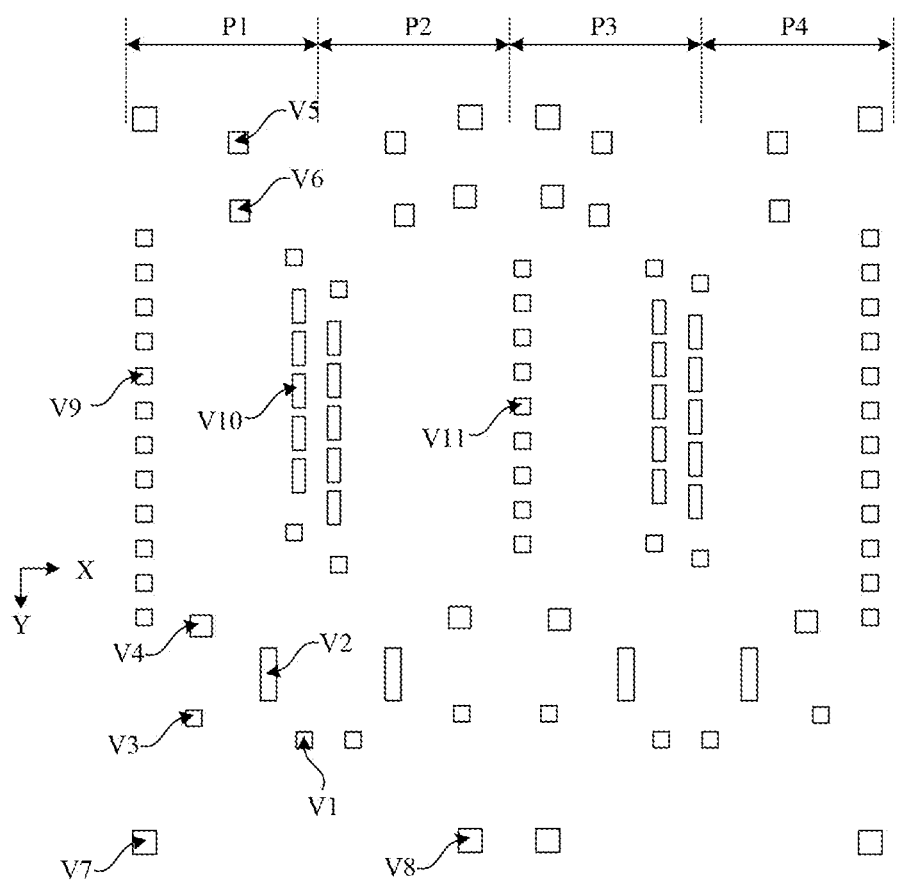

(5) A third insulating layer pattern is formed. In an exemplary embodiment, the forming the third insulating layer pattern may include: depositing a third insulating film on the substrate on which the aforementioned patterns are formed, and pattering the third insulating film through a patterning process to form a third insulating layer covering the third conductive layer, and providing multiple vias on the third insulating layer; wherein the multiple vias at least include: a first via V1, a second via V2, a third via V3, a fourth via V4, a fifth via V5, a sixth via V6, a seventh via V7, an eighth via V8, a ninth via V9, a tenth via V10 and an eleventh via V11, as shown in FIG. 10a and FIG. 10b, where FIG. 10b is a schematic plan view of multiple vias in FIG. 10a.

In an exemplary embodiment, the first via V1 may be provided in each sub-pixel, and the orthographic projection of the first via V1 on the substrate is located within the orthographic projection of the first region 31-1 of the first active layer 31 on the substrate. The third insulating layer and the second insulating layer in the first via V1 are etched away, exposing the surface of the first region 31-1 of the first active layer 31. In an exemplary embodiment, the first via V1 is configured to connect a data signal line formed subsequently to the first active layer 31.

In an exemplary embodiment, a second via V2 may be provided in each sub-pixel, an orthographic projection of the second via V2 on the substrate is within the range of an orthographic projection of the second region 31-2 of the first active layer 31 on the substrate, and an orthographic projection of the second via V2 on the substrate at least partially overlaps an orthographic projection of the second gate electrode 43 on the substrate. The third insulating layer and the second insulating layer in the second via V2 are etched away, simultaneously exposing the surface of the second region 31-2 of the first active layer 31 and the surface of the second gate electrode 43. The second via V2 is a transfer via consists of two half holes, one half hole is formed on the second region 31-2 of the first active layer 31, and the other half hole is formed on the second gate electrode 43, so that the transfer via composed of two half holes exposes the surface of the second region 31-2 of the first active layer 31 and the surface of the second gate electrode 43 at the same time. In an exemplary embodiment, the second via V2 is configured so that the second electrode of the subsequently formed first transistor T1 is connected to the second gate electrode 43 and the first active layer 31 simultaneously.

In an exemplary embodiment, the third via V3 may be provided in each sub-pixel, and the orthographic projection of the third via V3 on the substrate is located within the orthographic projection of the first region 32-1 of the second active layer 32 on the substrate. The third insulating layer and the second insulating layer in the third via V3 are etched away, exposing the surface of the first region 32-1 of the second active layer 32. In an exemplary embodiment, the third via V3 is configured to connect a subsequently formed first power supply line or a fifth connection electrode to the second active layer 32.

In an exemplary embodiment, a fourth via V4 may be provided in each sub-pixel. On one hand, an orthographic projection of the fourth via V4 on the substrate at least partially overlaps an orthographic projection of the second region 32-2 of the second active layer 32 on the substrate; on the other hand, the orthographic projection of the fourth via V4 at least partially overlaps the orthographic projection of the circuit part 12 on the substrate. A third insulating layer, a second insulating layer and a first insulating layer in the fourth via V4 are etched away, exposing the surface of the second region 32-2 of the second active layer 32 and the surface of the circuit part 12. In an exemplary embodiment, the second region 32-2 is configured so that the second electrode of the second transistor T2 which is subsequently formed is simultaneously connected to the circuit part 12 and the second active layer 32.

In an exemplary embodiment, a fifth via V5 may be provided in each sub-pixel. On one hand, an orthographic projection of the fifth via V5 on the substrate at least partially overlaps an orthographic projection of the first region 33-1 of the third active layer 33 on the substrate; on the other hand, the orthographic projection of the fifth via V5 at least partially overlaps the orthographic projection of the compensation connection line 22 on the substrate. A third insulating layer, a second insulating layer and a first insulating layer in the fifth via V5 are etched away, simultaneously exposing the surface of the first region 33-1 of the third active layer 33 and the surface of the compensation connection line 22. In an exemplary embodiment, the fifth Via V5 is configured so that the first electrode of the subsequently formed third transistor T3 is simultaneously connected to the compensation connection line 22 and the third active layer 33.

In an exemplary embodiment, a sixth via V6 may be provided in each sub-pixel. On one hand, an orthographic projection of the sixth via V6 on the substrate at least partially overlaps an orthographic projection of the second region 33-2 of the third active layer 33 on the substrate; on the other hand, the orthographic projection of the sixth via V6 at least partially overlaps the orthographic projection of the interlayer connection electrode 24 on the substrate. A third insulating layer, a second insulating layer and a first insulating layer in the sixth via V6 are etched away, simultaneously exposing the surface of the second region 33-2 of the third active layer 33 and the surface of the interlayer connection electrode 24. In an exemplary embodiment, the sixth Via V6 is configured so that the second electrode of the subsequently formed third transistor T3 is simultaneously connected to the interlayer connection electrode 24 and the third active layer 33.

In an exemplary embodiment, a seventh via V7 may be provided in the first sub-pixel P1 and the fourth sub-pixel P4, an orthographic projection of the seventh via V7 on the substrate is within the range of an orthographic projection of the first end of the power supply connection line 21 on the substrate, and a third insulating layer, a second insulating layer and a first insulating layer in the seventh via V7 are etched away to expose the surface of the first end of the power supply connection line 21. In the exemplary embodiment, the seventh via V7 is configured so that the first power supply line formed subsequently is connected to the first end of the power supply connection line 21.

In an exemplary embodiment, an eighth via V8 may be provided at the second sub-pixel P2 and the third sub-pixel P3, an orthographic projection of the eighth via V8 on the substrate is within an orthographic projection of the second end of the power supply connection line 21 on the substrate, and a third insulating layer, a second insulating layer and a first insulating layer in the eighth via V8 are etched away to expose the surface of the second end of the power supply connection line 21. In an exemplary embodiment, the eighth Via V8 is configured so that the first electrode of the second transistor T2 which is subsequently formed is connected to the second end of the power supply connection line 21 through the Via V8.

In an exemplary embodiment, a ninth via V9 may be provided at the first sub-pixel P1 and the fourth sub-pixel P4, an orthographic projection of the ninth via V9 on the substrate is within the range of an orthographic projection of the auxiliary power supply line 44 on the substrate, and the third insulating layer in the ninth via V9 is etched away, exposing the surface of the auxiliary power supply line 44. In the exemplary embodiment, the ninth via V9 is configured so that the first power supply line formed subsequently is connected to the auxiliary power supply line 44. In an exemplary embodiment, the ninth vias V9 may be plural, and the multiple ninth vias V9 may be sequentially arranged along the second direction Y to increase the connection reliability between the first power supply line and the auxiliary power line 44.

In an exemplary embodiment, the tenth via V10 may be disposed in each sub-pixel, and an orthographic projection of the tenth via V10 on the substrate is within the range of an orthographic projection of the auxiliary data line 45 on the substrate. A third insulating layer in the tenth via V10 is etched away, exposing the surface of the auxiliary data line 45. In the exemplary embodiment, the tenth Via V10 is configured so that a data signal line formed subsequently is connected to the auxiliary data line 45 through the via. In an exemplary embodiment, the tenth vias V10 may be plural, and the multiple tenth vias V10 may be sequentially arranged along the second direction Y to increase the connection reliability between the data signal line and the auxiliary data line 45.

In an exemplary embodiment, an eleventh via V11 may be disposed between the second sub-pixel P2 and the third sub-pixel P3, an orthographic projection of the eleventh via V11 on the substrate is within the range of an orthographic projection of the auxiliary compensation line 46 on the substrate, and a third insulating layer in the eleventh via V11 is etched away, exposing the surface of the auxiliary compensation line 46. In the exemplary embodiment, the eleventh Via V11 is configured so that a compensation signal line formed subsequently is connected to the auxiliary compensation line 46 through the via. In an exemplary embodiment, the eleventh vias V11 may be plural, and the multiple eleventh vias V11 may be sequentially arranged along the second direction Y to increase the connection reliability between the compensation signal line and the auxiliary compensation line 46.

Figure 11A:
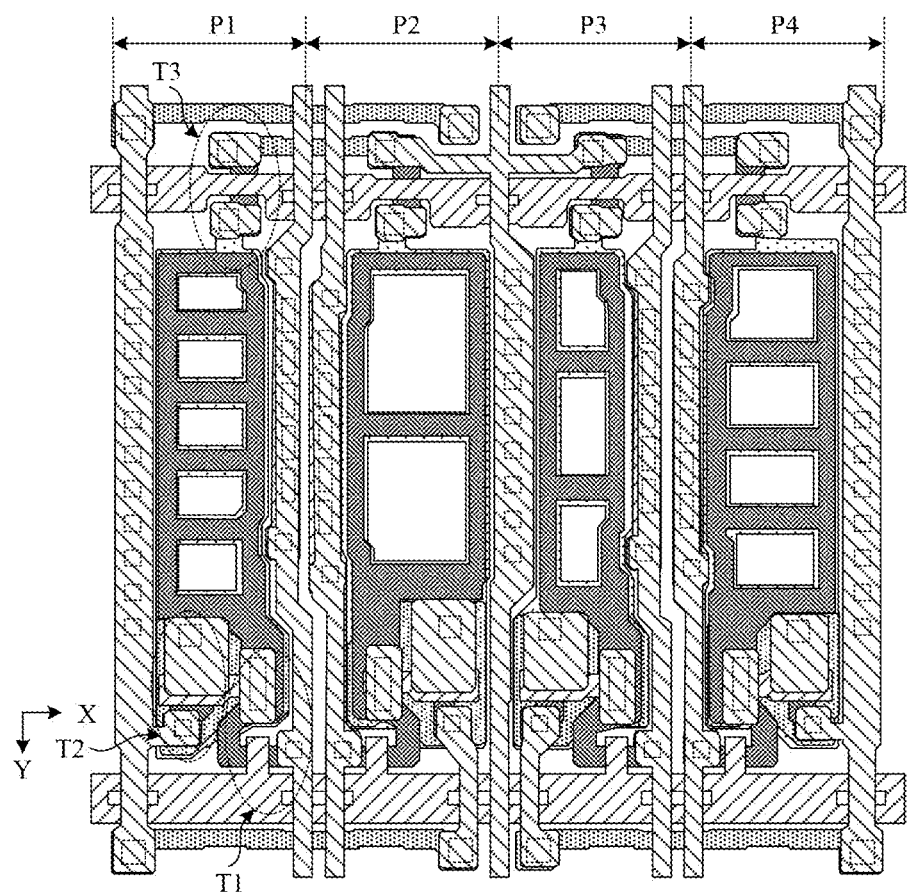
FIG. 11a is a schematic diagram after a pattern of a fourth conductive layer is formed according to an exemplary embodiment of the present disclosure.
Figure 11B:
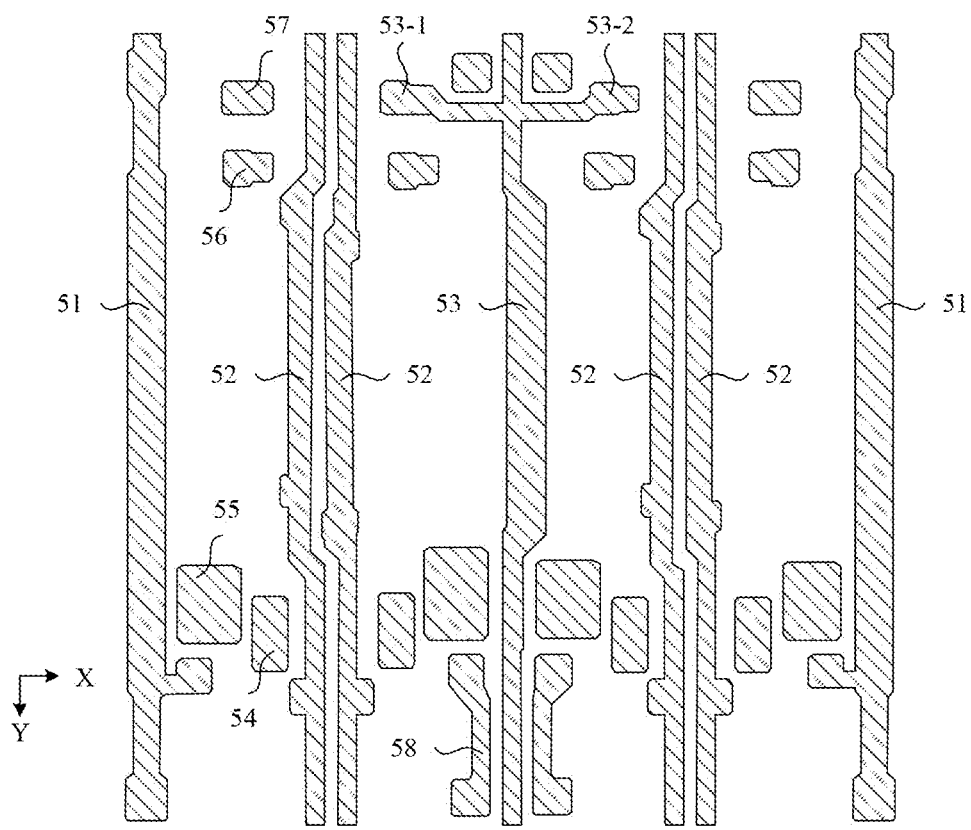

(6) A fourth conductive layer pattern is formed. In an exemplary embodiment, forming the fourth conductive layer pattern may include: depositing a fourth conductive film on the substrate on which the aforementioned patterns are formed, patterning the fourth conductive film by a patterning process to form forming a fourth conductive layer disposed on the third insulating layer. The fourth conductive layer at least includes a first power supply line 51, a data signal line 52, a compensation signal line 53, a first connection electrode 54, a second connection electrode 55, a third connection electrode 56, a fourth connection electrode 57 and a fifth connection electrode 58, as shown in FIG. 11a and FIG. 11b, where FIG. 11b is a schematic plan view of the fourth conductive layer in FIG. 11a. In an exemplary embodiment, the fourth conductive layer may be referred to as a source drain metal (SD) layer.

In the exemplary embodiment, a first power supply line 51 is provided at the first sub-pixel P1 and the fourth sub-pixel P4 respectively, and a main part of the first power supply line 51 extends along the second direction Y. In one aspect, the first power supply line 51 is connected to the first region 32-1 of the second active layer 32 through a third via V3, so that the power supply signal is written to the second transistor T2. In another aspect, the first power supply line 51 is connected to the auxiliary power supply line 44 through multiple ninth vias V9, so that the first power supply line 51 and the auxiliary power supply line 44 form a double-layer track. In yet another aspect, the first power supply line 51 is connected to a first end of the power supply connection line 21 through a seventh via V7, so that the power supply connection line 21 can transmit power supply signals to the second sub-pixel P2 and the third sub-pixel P3, respectively.

In the exemplary embodiment, data signal lines 52 are respectively provided at each sub-pixel and a main part of the data signal lines 52 extends along the second direction Y. In one aspect, the data signal line 52 is connected to the first region 31-1 of the first active layer 31 through a first via V1, so that the data signal is written to the first transistor T1. In another aspect, the data signal line 52 is connected to the data line 45 through multiple tenth vias V10, so that the data signal line 52 and the data line 45 form a double-layer track.

In the exemplary embodiment, a compensation signal line 53 is disposed between the second sub-pixel P2 and the third sub-pixel P3 and a main part of the compensation signal line 53 extends in the second direction Y. The compensation signal line 53 is connected to the auxiliary compensation line 46 through multiple eleventh vias V11, so that the compensation signal line 53 and the auxiliary compensation line 46 form a double-layer track.

In the exemplary embodiment, the compensation signal line 53 is provided with a first protrusion 53-1 and a second protrusion 53-2. A first end of the first protrusion 53-1 is connected to the compensation signal line 53, a second end of the first protrusion 53-1 extends to the second sub-pixel P2 in the opposite direction of the first direction X, and is simultaneously connected to the first region 33-1 of the third active layer 33 and the compensation connection line 22 through the fifth via V5 of the sub-pixel. On the one hand, the compensation signal is written to the third transistor T3 of the second sub-pixel P2, and on the other hand, the compensation signal is transmitted to the compensation connection line 22. A first end of the second protrusion 53-2 is connected to the compensation signal line 53, a second end of the second protrusion 53-2 extends to the third sub-pixel P3 in the first direction X, and is simultaneously connected to the first region 33-1 of the third active layer 33 and the second compensation connection line 24 through the fifth via V5 of the sub-pixel. On the one hand, the compensation signal is written to the third transistor T3 of the third sub-pixel P3, and on the other hand, the compensation signal is transmitted to the second compensation connection line 24 for connection.

In an exemplary embodiment, the first connection electrodes 54 are respectively provided at each sub-pixel and may be in a rectangular shape. The first connection electrode 54 in each sub-pixel is simultaneously connected to the second region 31-2 of the first active layer 31 and the second gate electrode 43 through the second via V2. In an exemplary embodiment, a first connection electrode 54 is used as the second electrode of a first transistor T1. Since the second region 31-2 of the first active layer 31 is connected to the second electrode plate 34, the first connection electrode 54 causes the second electrode of the first transistor T1, the second gate electrode 43 and the second electrode plate 34 to have the same potential, that is, the potential of the first node N1.

In an exemplary embodiment, the second connection electrodes 55 are respectively provided at each sub-pixel and may be in a rectangular shape. The second connection electrode 55 in each sub-pixel is simultaneously connected to the second region 32-2 of the second active layer 32 and the circuit part 12 through the fourth via V4. In an exemplary embodiment, a second connection electrode 55 is used as the second electrode of a second transistor T2. Since the circuit part 12 is connected to the first electrode plate 11, the second connection electrode 55 causes the second electrode of the second transistor T2 and the first electrode plate 11 to have the same potential.

In an exemplary embodiment, the third connection electrodes 56 are respectively provided at each sub-pixel and may be in a rectangular shape. The third connection electrode 56 in each sub-pixel is simultaneously connected to the second region 33-2 of the third active layer 33 and the interlayer connection electrode 24 through the sixth via V6. In an exemplary embodiment, a third connection electrode 56 is used as the second electrode of a third transistor T3. Since the interlayer connection electrode 24 is connected to the connection part 13, which is connected to the first electrode plate 11, the third connection electrode 56 causes the second electrode of the third transistor T3 and the first electrode plate 11 to have the same potential.

Since the second connection electrode 55 causes the first electrode plate 11 and the second electrode of the second transistor T2 have the same potential, the third connection electrode 56 causes the first electrode plate 11 and the second electrode of the third transistor T3 to have the same potential, so that the second electrode of the second transistor T2, the second electrode of the third transistor T3 and the first electrode plate 11 have the same potential, that is, the potential of the second node N2.

In an exemplary embodiment, the fourth connection electrode 57 is provided at the first sub-pixel P1 and the fourth sub-pixel P4 respectively and may be in a rectangular shape. The fourth connection electrode 57 in the first sub-pixel P1 is simultaneously connected to the first region 33-1 of the third active layer 33 and the compensation connection line 22 through the fifth via V5 of the sub-pixel. In the exemplary embodiment, the fourth connection electrode 57 is used as the first electrode of the third transistor T3. Since the compensation connection line 22 is connected to the compensation signal line 53, the fourth connection electrode 57 can write the compensation signal to the third transistor T3 of the first sub-pixel P1. The fourth connection electrode 57 in the fourth sub-pixel P4 is simultaneously connected to the first region 33-1 of the third active layer 33 and the second compensation connection line 24 through the fifth via V5 of the sub-pixel. In the exemplary embodiment, the fourth connection electrode 57 is used as the first electrode of the third transistor T3. Since the compensation connection line 22 is connected to the compensation signal line 53, the fourth connection electrode 57 can write the compensation signal to the third transistor T3 of the fourth sub-pixel P4.

In an exemplary embodiment, the fifth connection electrode 58 is provided at the second sub-pixel P2 and the third sub-pixel P3 respectively, and may be in a bar shape extending along the second direction Y. The first end of the fifth connection electrode 58 is connected to the power supply connection line 21 through an eighth via V8, and the second end of the fifth connection electrode 58 is connected to the first region 32-1 of the second active layer 32 through a third via V3 of the sub-pixel. In an exemplary embodiment, the fifth connection electrode 58 is used as the first electrode of a second transistor T2. Since the power supply connection line 21 is connected to the first power supply line 51, the fifth connection electrode 58 can write a power supply signal to the second transistor T2 of the second sub-pixel P2 and the third sub-pixel P3.

The exemplary embodiment of the present disclosure achieves writing power supply signals to the second transistors T2 of four sub-pixels respectively by providing two first power supply lines 51 extending along the second direction Y and two power supply connection lines 21 extending along the first direction X. In the first sub-pixel P1 and the fourth sub-pixel P4, the first power supply lines 51 are directly connected to the second transistors T2 through a via, respectively. In the second sub-pixel P2 and the third sub-pixel P3, the first power supply lines 51 are connected to the second transistors T2 through the fifth connection electrode 58, respectively.

The exemplary embodiment of the present disclosure achieves writing compensation signals to the third transistors T3 of four sub-pixels respectively by providing one compensation signal line 53 having its main part extending along the second direction Y and two compensation connection lines 22 extending along the first direction X. In the second sub-pixel P2 and the third sub-pixel P3, the compensation signal lines 53 are directly connected to the third transistors T3 through a via, respectively. In the first sub-pixel P1 and the fourth sub-pixel P4, the compensation signal lines 53 are connected to the third transistors T3 through the compensation connection line 22 respectively. The present invention provides compensation signals to four sub-pixels by providing a compensation signal line, which can ensure that the RC delay of the compensation signals is basically the same before being written into the transistor, thus ensuring the uniformity of the display.

Exemplary embodiments of the present disclosure enable writing data signals to the first transistors T1 of four sub-pixels respectively by providing data signal lines 52 extending along the second direction Y in each sub-pixel, the data signal lines 52 is connected to the first transistors T1 of the sub-pixels through vias.

In an exemplary embodiment, the first power supply line 51, the data signal line 52 and the compensation signal line 53 may be straight or polylines of equal or unequal widths. The first power supply line 51, the data signal line 52 and the compensation signal line 53 are straight or polyines with variable widths, which not only facilitates the layout of the pixel structure, but also reduces parasitic capacitance.

Figure 12A:
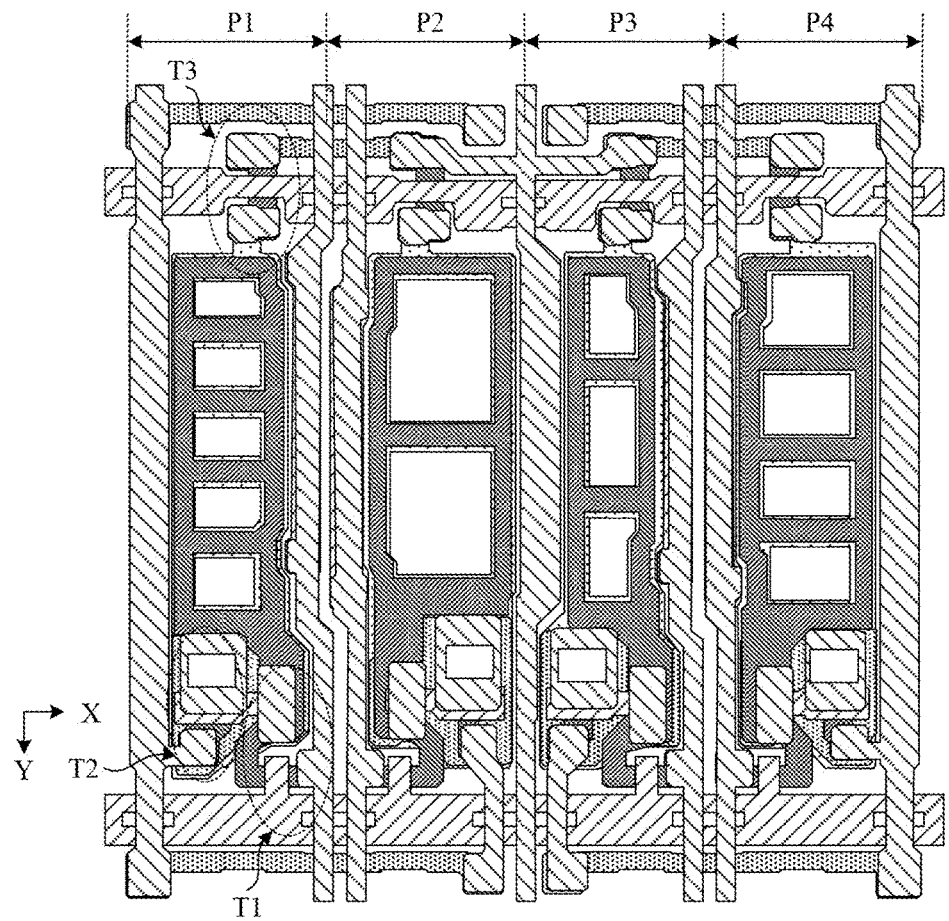
FIG. 12a is a schematic diagram after a pattern of a planarization layer is formed according to an exemplary embodiment of the present disclosure.
Figure 12B:
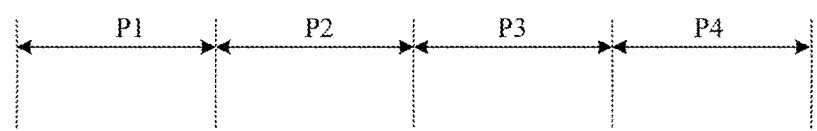
Figure 12B:
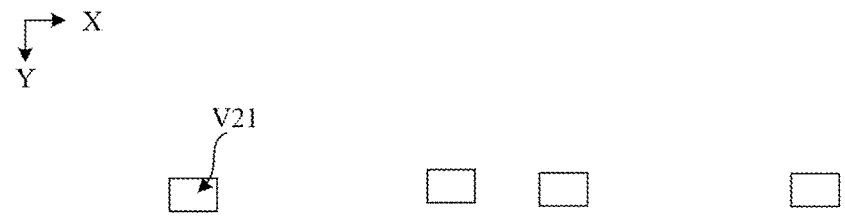

(7) A planarization layer pattern is formed. In an exemplary embodiment, the forming of a planarization layer pattern may include: coating a planarization film on the substrate on which the foregoing patterns are formed, patterning the planarization film through a patterning process to form a planarization layer covering the fourth conductive layer, wherein the planarization layer is provided with multiple vias, and the multiple vias at least include a twenty-first via V21 located in each sub-pixel, as shown in FIG. 12a and FIG. 12b, where FIG. 12b is a schematic plan view of multiple vias in FIG. 12a.

In an exemplary embodiment, the twenty-first via V21 may be disposed in each sub-pixel. An orthographic projection of the twenty-first via V21 on the substrate is within the range of an orthographic projection of the second connection electrode 55 on the substrate. The planarization layer in the via V21 is removed, exposing the surface of the second connection electrode 55. In an exemplary embodiment, the twenty-first via V21 is configured so that the anode formed subsequently is connected to the second connection electrode 55 through the via.

In an exemplary embodiment, the display substrate may include a fourth insulating layer and a color film layer. On the substrate on which the pattern is formed, a fourth insulating layer is formed, hen a color film layer is formed on the fourth insulating layer. Subsequently, a planarization film is coated, and the planarization film and the fourth insulating film are patterned through a patterning process to form a fourth insulating layer covering the fourth conductive layer, a color film layer disposed on the fourth insulating layer and a planarization layer pattern covering the color film layer, wherein multiple vias are provided on the planarization layer and the fourth insulating layer.

Hereto, the drive circuit layer pattern is prepared on the substrate. In a plane parallel to the display substrate, the drive circuit layer may include multiple sub-pixels, each sub-pixel may include a pixel drive circuit, and a first scan signal line, a second scan signal line, a first power supply line, a data signal line, and a compensation signal line connected to the pixel drive circuit. In a plane perpendicular to the display substrate, the drive circuit layer may include a first conductive layer, a second conductive layer, a first insulating layer, a semiconductor layer, a second insulating layer, a third conductive layer, a third insulating layer, a fourth conductive layer and a planarization layer that are sequentially stacked on the substrate.

In an exemplary embodiment, after the driver circuit layer is prepared, a emitting structure layer is prepared on the driver circuit layer, and the preparation process of the emitting structure layer may include the following acts.

Figure 13A:
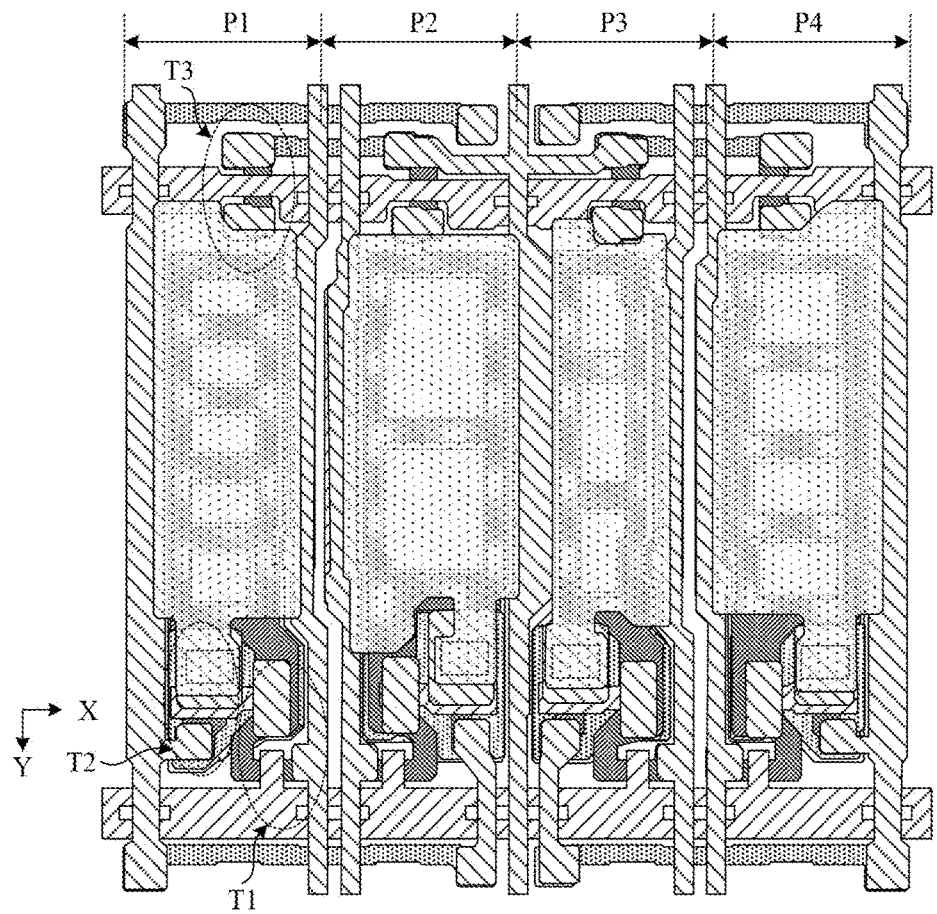
FIG. 13a is a schematic diagram after a pattern of a fifth conductive layer is formed according to an exemplary embodiment of the present disclosure.
Figure 13B:
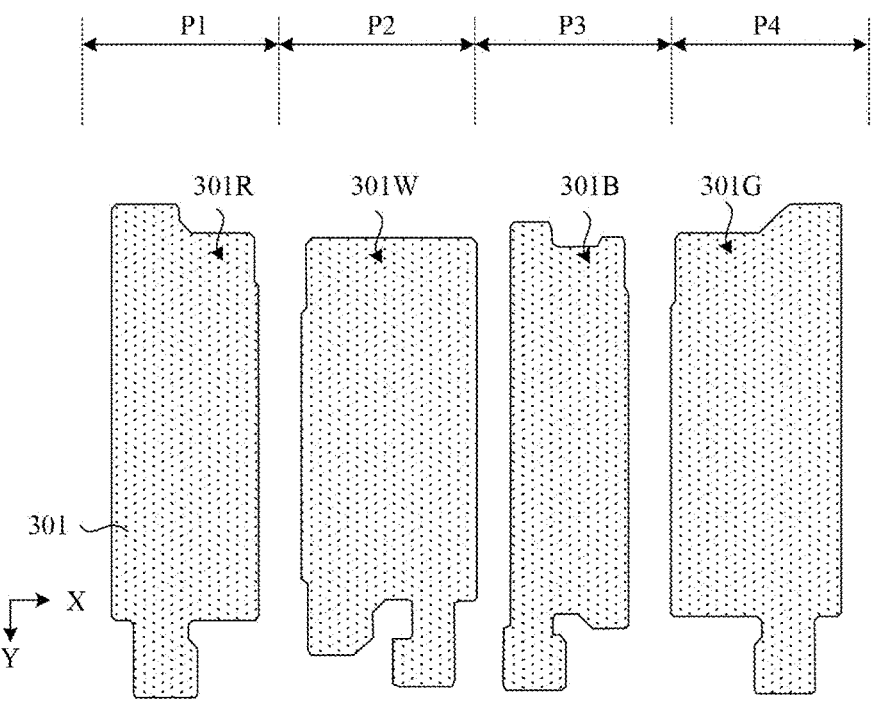

(8) A fifth conductive layer pattern is formed. In an exemplary embodiment, forming the fifth conductive layer pattern may include: depositing a fifth conductive film on the substrate on which the aforementioned pattern is formed, and patterning the fifth conductive film through a patterning process to form a the fifth conductive layer pattern, which includes an anode 301 in each sub-pixel, as shown in FIG. 13*a* and FIG. 13*b*, where FIG. 13*b* is a schematic plan view of the fifth conductive layer in FIG. 13*a*. In an exemplary embodiment, the fifth conductive layer is referred to as the second transparent (ITO2) layer.

In an exemplary embodiment, the fifth conductive layer pattern may include a red anode 301R located in the first sub-pixel P1, a white anode 301W located in the second sub-pixel P2, a blue anode 301B located in the third sub-pixel P3, and a green anode 301G located in the fourth sub-pixel P4. An anode 301 in each sub-pixel is connected to a second connection electrode 55 through a twenty-first via V21. Since the second connection electrode 55 is used as the second electrode of the second transistor T2, the connection of the anode 301 with the second transistor T2 is implemented.

In an exemplary embodiment, the red anode 301R, the white anode 301W, the blue anode 301B, and the green anode 301G may be in a strip shape extending along the second reverse direction Y. One side of the anode in the opposite direction of second direction Y in each sub-pixel is provided with a protrusion, which is connected to the second connection electrode 55 through a twenty-first via V21.

In an exemplary embodiment, an orthographic projection of the anode in each sub-pixel on the substrate includes an orthographic projection of the storage capacitance in the sub-pixel on the substrate.

Figure 14A:
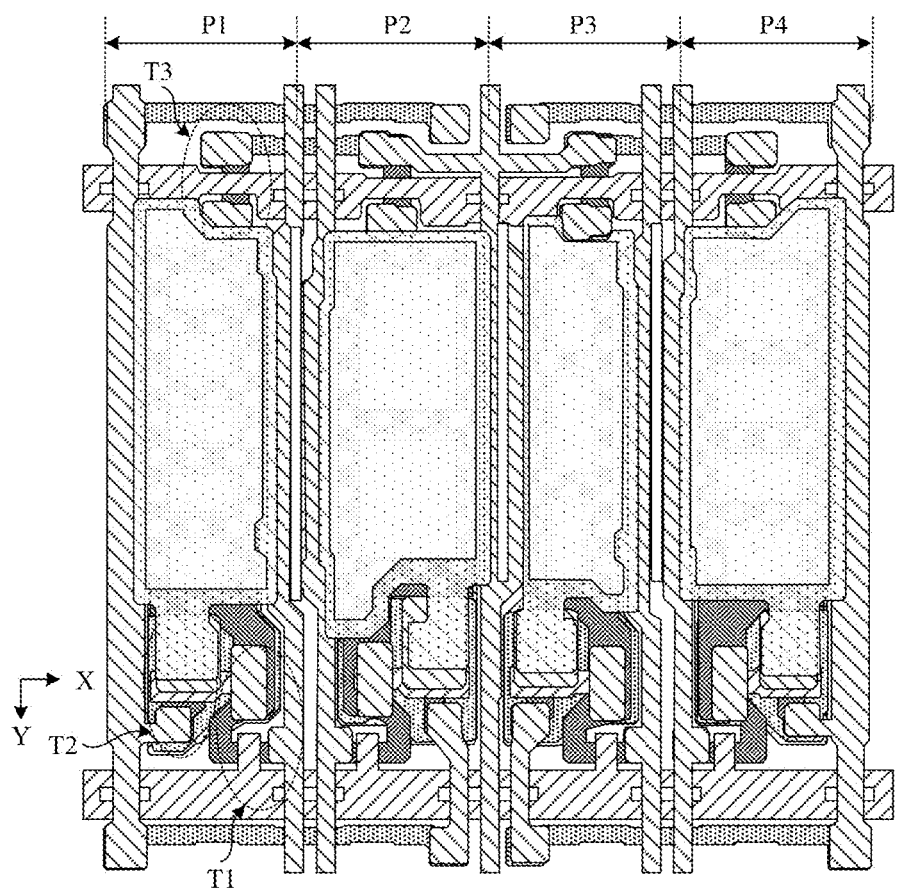
FIG. 14a is a schematic diagram after a pattern of a pixel define layer is formed according to an exemplary embodiment of the present disclosure.
Figure 14B:
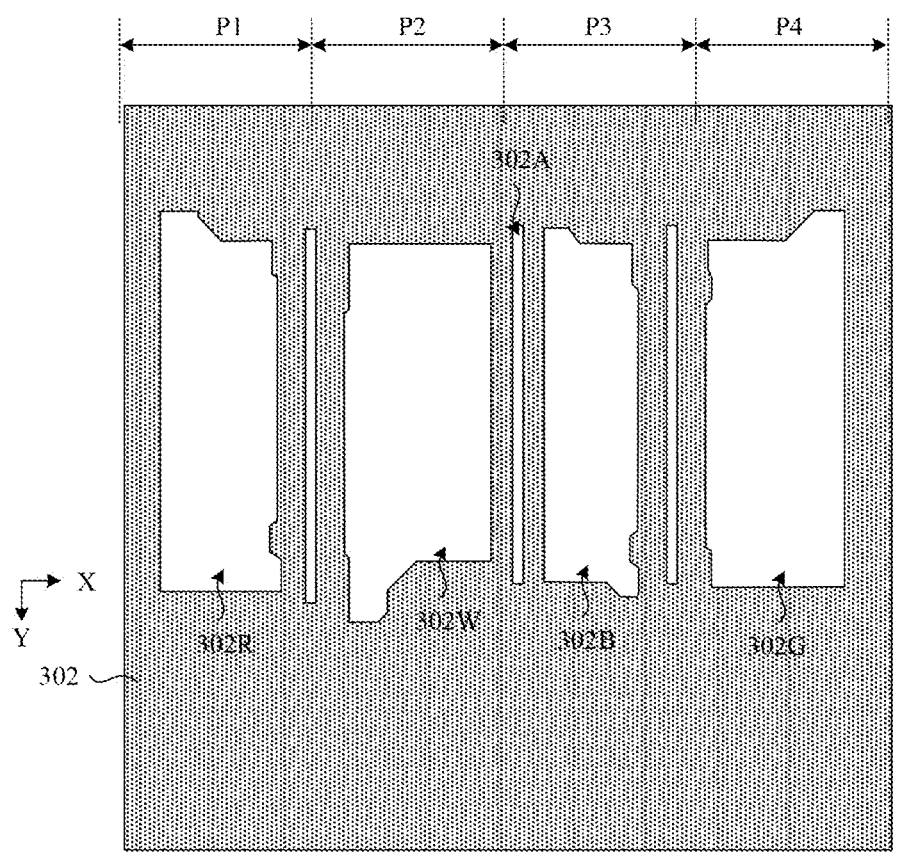

(9) A pixel define layer pattern is formed. In an exemplary embodiment, forming the pixel define layer pattern may include: coating a pixel define film on the substrate on which the aforementioned patterns are formed, and patterning the pixel define film through a patterning process to form a pattern of a pixel define layer 302 including at least a pixel opening in each sub-pixel, as shown in FIGS. 14A and 14B, where FIG. 14*b* is a schematic plan view of the pixel define layer in FIG. 14*a*.

In an exemplary embodiment, the pattern of pixel define layer 302 may include a red pixel opening 302R in the first sub-pixel P1 exposing the red anode 301R, a white pixel opening 302W in the second sub-pixel P2 exposing the white anode 301W, a blue pixel opening 302B in the third sub-pixel P3 exposing the blue anode 301B, and a green opening 302G in the fourth sub-pixel P4 exposing the green anode 301G.

In an exemplary embodiment, the shape and area of the pixel openings of different sub-pixels may be different. By designing four sub-pixels with different aperture ratios, the exemplary embodiment of the present disclosure can adapt to the transmittance of color film layers of different sub-pixels, so that the light emitting devices of the four sub-pixels can emit the same brightness at different currents, optimize the service life of the four sub-pixel light emitting devices to the maximum extent, and thereby ensuring the service life of products.

In an exemplary embodiment, the pattern of pixel define layer 302 may further include a spacer groove 302A, the shape of which may be a strip shape extending along the second direction Y, which may be respectively disposed between adjacent sub-pixels, and the spacer groove 302A is configured to reduce light leakage between adjacent sub-pixels.

In an exemplary embodiment, an orthographic projection of a pixel opening in each sub-pixel on the substrate at least partially overlaps an orthographic projection of a storage capacitor of the sub-pixel on the substrate.

In an exemplary embodiment, an orthographic projection of a capacitor opening of a storage capacitor in each sub-pixel on the substrate may be within the range of an orthographic projection of a pixel opening in the sub-pixel where it is located on the substrate.

In an exemplary embodiment, an orthographic projection of a spacer bezel of a storage capacitor in each sub-pixel on the substrate may be within the range of an orthographic projection of a pixel opening in the sub-pixel where it is located on the substrate.

In an exemplary embodiment, an orthographic projection of the pixel opening on the substrate at least partially overlaps an orthographic projection of the storage capacitor on the substrate may include any one or more of the following: an orthographic projection of a first bezel of a storage capacitor in each sub-pixel on the substrate may be within the range of an orthographic projection of a pixel opening in the sub-pixel where it is located on the substrate, an orthographic projection of a second bezel of a storage capacitor in each sub-pixel on the substrate may be within the range of an orthographic projection of a pixel opening in the sub-pixel where it is located on the substrate, an orthographic projection of a third bezel of a storage capacitor in each sub-pixel on the substrate may be within the range of an orthographic projection of a pixel opening in the sub-pixel where it is located on the substrate, and an orthographic projection of a fourth bezel of a storage capacitor in each sub-pixel on the substrate may be within the range of an orthographic projection of a pixel opening in the sub-pixel where it is located on the substrate.

In an exemplary embodiment, an orthographic projection of the pixel opening on the substrate at least partially overlaps an orthographic projection of the storage capacitor on the substrate may include any one or more of the following: an orthographic projection of the outer edge of the first bezel of the storage capacitor in each sub-pixel on the substrate may substantially overlap an orthographic projection of the edge of the pixel opening in the sub-pixel on the substrate, an orthographic projection of the outer edge of the second bezel of the storage capacitor in each sub-pixel on the substrate may substantially overlap an orthographic projection of the edge of the pixel opening in the sub-pixel on the substrate, an orthographic projection of the outer edge of the third bezel of the storage capacitor in each sub-pixel on the substrate may substantially overlap an orthographic projection of the edge of the pixel opening in the sub-pixel on the substrate, and an orthographic projection of the outer edge of the fourth bezel of the storage capacitor in each sub-pixel on the substrate may substantially overlap an orthographic projection of the edge of the pixel opening in the sub-pixel on the substrate.

In the exemplary embodiment, at least one of the pixel openings may be divided into a fully transparent region and a non-fully transparent region. The non-fully transparent region may include a region where the capacitor housing is located in the pixel opening, and the fully transparent region may include a region other than the capacitor housing in the pixel opening. In an exemplary embodiment, the ratio of the area of an orthographic projection of the fully transparent region on the substrate to the area of an orthographic projection of the non-fully transparent region on the substrate may be about 0.8 to 1.2. The exemplary embodiment of the present disclosure can improve the pixel aperture ratio and display quality on the basis of ensuring the storage capacitance through the equally divided design of the fully transparent region and the non-fully transparent region.

In an exemplary embodiment, the area of an orthographic projection of the fully transparent region on the substrate may be equal to the area of an orthographic projection of the non-fully transparent region on the substrate.

In an exemplary embodiment, a subsequent preparation process may include: forming an organic emitting layer using evaporation or ink-jet printing process, the organic emitting layer is connected to an anode through a pixel opening, and forming a cathode on the organic emitting layer, and the cathode is connected to the organic emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it may be ensured that external water vapor cannot enter the emitting structure layer.

In some exemplary embodiments, the first conductive layer and the fifth conductive layer may be made of a transparent conductive material, such as Indium Tin Oxide (ITO) and Indium Zinc Oxide (IZO). The second conductive layer, the third conductive layer and the fourth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayers, or composite layer. The first insulating layer is referred to as a buffer layer, the second insulating layer is referred to as a gate insulating (GI) layer, the third insulating layer is referred to as an interlayer dielectric (ILD) layer, and the fourth insulating layer is referred to as a passivation (PVX) layer. The planarization thin film may be made of an organic material such as resin. The pixel define layer may be made of polyimide, acrylic or polyethylene terephthalate.

As shown in FIGS. 5A to 14b, a display substrate in accordance with an exemplary embodiment of the present disclosure may include:

a substrate;

a first conductive layer disposed on the substrate, the first conductive layer at least includes a first electrode plate 11 having a ring structure;

a second conductive layer disposed on the first conductive layer, the second conductive layer includes at least a power supply connection line 21, a compensation connection line 22 and a shield layer 23;

a first insulating layer covering the second conductive layer;

a semiconductor layer disposed on the first insulating layer, the semiconductor layer at least includes a first active layer 31, a second active layer 32, a third active layer 33 and a second electrode plate 34, and the second electrode plate 34 has a ring structure, the second electrode plate 34 and the first electrode plate 11 form a transparent ring storage capacitor;

a second insulating layer covering the semiconductor layer;

a third conductive layer disposed on the second insulating layer, which at least includes a first scan signal line 41, a second scan signal line 42 and gate electrodes of the three transistors;

a third insulating layer covering the third conductive layer, wherein the third insulating layer is provided with multiple vias;

a fourth conductive layer disposed on the third insulating layer, wherein the fourth conductive layer at least includes a first power supply line 51, a data signal line 52, a compensation signal line 53, and first electrodes and second electrodes of the three transistors;

a planarization layer covering the fourth conductive layer and is provided with multiple vias;

a fifth conductive layer disposed on the planarization layer, and the fifth conductive layer at least includes an anode 301; and a pixel define layer 302 is provided with a pixel opening exposing the anode 301.

As may be seen from the structure and preparation process of the display substrate described above, the display substrate provided by the exemplary embodiment of the present disclosure adopts a transparent storage capacitor structure, the storage capacitor is composed of a transparent first conductive layer and a transparent semiconductor layer. Since light may be emitted through the transparent storage capacitor, the storage capacitor may be arranged in a pixel opening, effectively increasing the pixel aperture ratio. By arranging two electrode plates of the storage capacitor into a ring structure, the ring storage capacitor formed in the exemplary embodiment of the present disclosure can improve the display uniformity while increasing the pixel aperture ratio, reduce the light leakage at the edge of the pixel aperture, and effectively improve the display quality. Because the transparent storage capacitor arranged in the pixel opening has a ring structure, only part of the rays emitted from the pixel opening are emitted through the two electrode plates of the storage capacitor, which effectively reduces the light loss caused by the rays passing through the two electrode plates, effectively avoids the deviation of the light color points (X, Y) caused by the rays passing through the two electrode plates, and maximizes the display uniformity. Because the spacing between pixel openings in adjacent sub-pixels is small, the light of one sub-pixel may be reflected or refracted from adjacent sub-pixels through cathode. The present invention can reduce the light leakage at the edge of the pixel opening by providing the ring bezel of the storage capacitor at the edge of the pixel opening and utilizing the light loss of the light passing through the ring bezel, thereby effectively reducing the light crosstalk and the color point offset. Compared with the conventional solution of reducing light crosstalk by increasing the spacing between adjacent pixel openings, the solution of the present disclosure does not reduce the aperture ratio and ensures the display quality. The manufacturing process according to the present disclosure may be implemented using the existing mature manufacturing equipment, and improvements to the existing process are small, such that it may be well compatible with the existing manufacturing process, be simple to implement, and be easy to practice, thereby achieving high production efficiency, low production cost and high yield rate.

Figure 15:
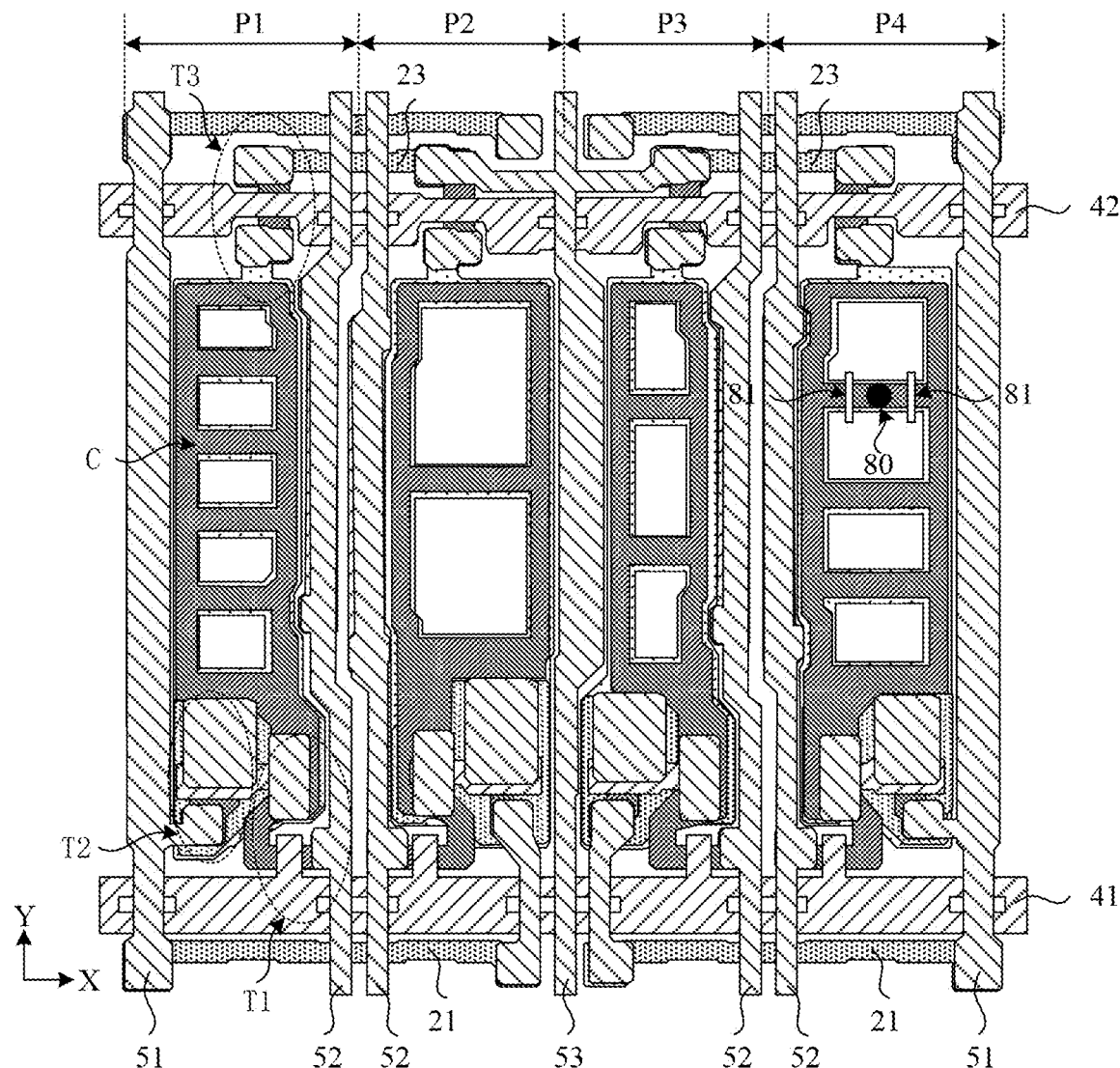
FIG. 15 is a schematic diagram of a storage capacitor repair according to an exemplary embodiment of the present disclosure.

FIG. 15 is a schematic diagram of a storage capacitor repair according to an exemplary embodiment of the present disclosure. As shown in FIG. 15, when a short-circuit point 80 appears on the first and second electrode plates of the storage capacitor, a cutting line 81 may be formed on both sides of the short-circuit point 80 by means of laser cutting or the like, and the cutting line 81 may cut the second electrode plate, or the first and second electrode plates may be cut. The design solution of the ring storage capacitor of the exemplary embodiment of the present disclosure can isolate short circuit points through a maintenance mode, thereby ensuring the normal lighting of sub-pixels, and effectively improve the product yield.

The structure and its preparing process of the present disclosure are only exemplarily described. In an exemplary embodiment, the corresponding structure may be changed and the patterning process may be added or reduced according to the actual needs. For example, the first transparent layer and the shield metal layer may be prepared simultaneously using a one-time patterning process of a gray or halftone mask. For another example, the display area may include 3 sub-pixels. For another example, the pixel drive circuit may be 5T1C or 7T1C and the like and the present disclosure is not limited herein;

In an exemplary implementation, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), which is not limited herein in the present disclosure.

Exemplary embodiments of the present disclosure further provide a method for preparing a display substrate, wherein the display substrate may include multiple sub-pixels, and at least one sub-pixel includes a drive circuit layer disposed on the substrate, the drive circuit layer includes a ring storage capacitor constituting a pixel drive circuit; the method may include:
forming a first electrode plate, the first electrode plate includes a first housing surrounding at least one first opening;
forming a second electrode plate, the second electrode plate includes a second bezel surrounding at least one second opening; an orthographic projection of the first housing on the substrate at least partially overlaps an orthographic projection of the second housing on the substrate, and the first housing and the second housing form a capacitor housing around at least one capacitor opening.

The present disclosure further provides a display apparatus including the display substrate in the aforementioned embodiments. The display apparatus may be any product or component with a display function, such as a mobile phone, a tablet computer, a television, a display, a notebook computer, a digital photo frame, or a navigator.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and alterations in forms and details of implementation without departing from the spirit and scope of the present disclosure. However, the patent protection scope of the present invention should be subject to the scope defined by the appended claims.

The invention claimed is:

1. A display substrate comprising a plurality of sub-pixels, wherein
at least one sub-pixel comprises a drive circuit layer disposed on the substrate,
the drive circuit layer comprises a ring storage capacitor constituting a pixel drive circuit,
the ring storage capacitor comprises a first electrode plate and a second electrode plate,
the first electrode plate comprises a first housing surrounding at least one first opening,
the second electrode plate comprises a second housing surrounding at least one second opening,
an orthographic projection of the first housing on the substrate at least partially overlaps an orthographic projection of the second housing on the substrate, and
the first housing and the second housing form a capacitor housing around at least one capacitor opening.

2. The display substrate of claim 1, wherein
the orthographic projection of the second housing on the substrate is within the range of the orthographic projection of the first housing on the substrate, and
the orthographic projection of the first opening on the substrate is within the range of the orthographic projection of the second opening on the substrate.

3. The display substrate of claim 1, wherein
the capacitor housing comprises a first bezel, a second bezel, a third bezel and a fourth bezel forming a ring, and at least one spacer bezel;
the first bezel and the third bezel are oppositely arranged, and the second bezel and the fourth bezel are oppositely arranged; and
a first end of at least one spacer bezel is connected to the first bezel, and a second end of the spacer bezel is connected to the third bezel.

4. The display substrate of claim 1, wherein
a side of the drive circuit layer away from the substrate is provided with an emitting structure layer, the emitting structure layer comprises a pixel define layer, and a pixel opening defining a light-emitting region is provided on the pixel define layer; and an orthographic projection of the ring storage capacitor on the substrate does not overlap an orthographic projection of the pixel opening on the substrate; or
a side of the drive circuit layer away from the substrate is provided with an emitting structure layer, and the emitting structure layer comprises a pixel define layer, and a pixel opening defining a light-emitting region is provided on the pixel define layer; and the orthographic projection of the ring storage capacitor on the substrate at least partially overlaps the orthographic projection of the pixel opening on the substrate.

5. The display substrate of claim 4, wherein an orthographic projection of the at least one capacitor opening on the substrate is within the range of an orthographic projection of the pixel opening on the substrate.

6. The display substrate of claim 4, wherein
the orthographic projection of the ring storage capacitor on the substrate at least partially overlapping the orthographic projection of the pixel opening on the substrate comprises any one or more of the following:
the orthographic projection of the first bezel on the substrate is within the range of the orthographic projection of the pixel opening on the substrate,
the orthographic projection of the second bezel on the substrate is within the range of the orthographic projection of the pixel opening on the substrate,
the orthographic projection of the third bezel on the substrate is within the range of the orthographic projection of the pixel opening on the substrate, and the orthographic projection of the fourth bezel on the substrate is within the range of the orthographic projection of the pixel opening on the substrate.

7. The display substrate of claim 4, wherein the orthographic projection of the ring storage capacitor on the substrate at least partially overlapping the orthographic projection of the pixel opening on the substrate comprises any one or more of the following:
an orthographic projection of an outer edge of the first bezel on the substrate substantially overlaps an orthographic projection of an edge of the pixel opening on the substrate,
an orthographic projection of an outer edge of the second bezel on the substrate substantially overlaps an orthographic projection of an edge of the pixel opening on the substrate,
an orthographic projection of the outer edge of the third bezel on the substrate substantially overlaps an orthographic projection of an edge of the pixel opening on the substrate, and
an orthographic projection of the outer edge of the fourth bezel on the substrate substantially overlaps an orthographic projection of an edge of the pixel opening on the substrate.

8. The display substrate of claim 1, wherein in a plane parallel to the display substrate, the shape of the capacitor opening comprises any one or more of the following: triangle, rectangle, trapezoid, parallelogram, pentagon, hexagon, circle and ellipse; and/or
the first electrode plate and the second electrode plate are transparent conductive layers forming a transparent ring storage capacitor.

9. The display substrate of claim 1, wherein the number of capacitor openings is plural.

10. The display substrate of claim 9, wherein
the plurality of sub-pixels comprise a first sub-pixel, a second sub-pixel, a third sub-pixel and a fourth sub-pixel arranged in sequence along a first direction,
a plurality of capacitor openings in at least one sub-pixel are arranged in sequence along a second direction, the number of capacitor openings in the four sub-pixels is different, and
the first direction intersects the second direction.

11. The display substrate of claim 10, wherein
the number of capacitor openings in the first sub-pixel is 5,
the number of capacitor openings in the second sub-pixel is 2,
the number of capacitor openings in the third sub-pixel is 3, and
the number of capacitor openings in the fourth sub-pixel is 4.

12. The display substrate of claim 1, wherein the ratio of an area of the orthographic projection of the capacitor opening on the substrate to an area of the orthographic projection of the capacitor housing on the substrate is 0.8 to 1.2.

13. The display substrate of claim 1, wherein
the drive circuit layer of at least one sub-pixel comprises a first conductive layer, a second conductive layer, a semiconductor layer, a third conductive layer and a fourth conductive layer sequentially arranged on the substrate,
the first electrode plate of the ring storage capacitor is located on the first conductive layer, and
the second electrode plate of the ring storage capacitor is located on the semiconductor layer.

14. The display substrate of claim 13, wherein
within at least one sub-pixel, the pixel drive circuit further comprises a first transistor, a second transistor, and a third transistor,
active layers of the first, second and third transistors are located on the semiconductor layer,
gate electrodes of the first, second and third transistors are located on the third conductive layer, and
first and second electrodes of the first, second and third transistors are located on the fourth conductive layer.

15. The display substrate of claim 13, wherein
in at least one sub-pixel, the pixel drive circuit further comprises a first scan signal line, a second scan signal line, a first power supply line, a data line and a compensation signal line,
the first scan signal line and the second scan signal line are located on the third conductive layer, and
the first power supply line, the data line and the compensation signal line are located on the fourth conductive layer.

16. The display substrate of claim 15, wherein
at least one via is provided on the first scan signal line and the second scan signal line;
an orthographic projection of the via on the substrate at least partially overlaps an orthographic projection of the first power supply line on the substrate, or, the orthographic projection of the via on the substrate at least partially overlaps the orthographic projection of the data signal line on the substrate, or the orthographic projection of the via on the substrate at least partially overlaps the orthographic projection of the compensation signal line on the substrate.

17. The display substrate of claim 16, wherein an area of the orthographic projection of the via on the substrate is smaller than an area of the orthographic projection of the capacitor opening on the substrate.

18. The display substrate of claim 14, wherein in at least one sub-pixel, the pixel drive circuit further comprises a shield layer located on the second conductive layer, and an orthographic projection of an active layer of the second transistor on the substrate is within a range of the orthographic projection of the shield layer on the substrate; and/or
in at least one sub-pixel, a second region of an active layer of the first transistor is connected to the second electrode plate, and the second region is in a polyline shape protruding toward adjacent sub-pixels.

19. A display apparatus, comprising the display substrate according to claim 1.

20. A method for preparing a display substrate comprising a plurality of sub-pixels, wherein at least one sub-pixel comprises a drive circuit layer disposed on the substrate, and the drive circuit layer comprises a ring storage capacitor constituting a pixel drive circuit; and the method comprises:
forming a first electrode plate, wherein the first electrode plate comprises a first housing surrounding at least one first opening; and
forming a second electrode plate, wherein the second electrode plate comprises a second bezel surrounding at least one second opening, an orthographic projection of the first housing on the substrate at least partially overlaps an orthographic projection of the second housing on the substrate, and the first housing and the second housing form a capacitor housing around at least one capacitor opening.

* * * * *